(12) United States Patent
Kang

(10) Patent No.: US 11,646,303 B2
(45) Date of Patent: May 9, 2023

(54) DISPLAY DEVICE

(71) Applicant: Samsung Display Co., Ltd., Yongin-Si (KR)

(72) Inventor: Byeong Soo Kang, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/678,833

(22) Filed: Feb. 23, 2022

(65) Prior Publication Data
US 2023/0040529 A1 Feb. 9, 2023

(30) Foreign Application Priority Data

Aug. 3, 2021 (KR) ........................ 10-2021-0102030

(51) Int. Cl.
*H01L 25/18* (2006.01)
*H01L 27/32* (2006.01)
*G09G 3/3225* (2016.01)

(52) U.S. Cl.
CPC ........... *H01L 25/18* (2013.01); *G09G 3/3225* (2013.01); *H01L 27/3276* (2013.01); *G09G 2300/0426* (2013.01); *G09G 2310/0297* (2013.01); *H01L 2251/5338* (2013.01)

(58) Field of Classification Search
None
See application file for complete search history.

(56) References Cited

U.S. PATENT DOCUMENTS

| 2017/0263567 A1* | 9/2017 | Moon | H01L 23/585 |
| 2019/0171075 A1* | 6/2019 | Yoshida | G02F 1/136259 |
| 2019/0392771 A1* | 12/2019 | Xu | G09G 3/3446 |
| 2020/0394967 A1* | 12/2020 | Park | G06F 1/1601 |

FOREIGN PATENT DOCUMENTS

KR 10-2020-0143558 A 12/2020

* cited by examiner

*Primary Examiner* — Christopher J Kohlman
(74) *Attorney, Agent, or Firm* — Innovation Counsel LLP

(57) ABSTRACT

A display device includes a display panel, a first line, a second line, a first driver, and a second driver. The display panel includes a first display area, a second display area, a third display area, and a fourth display area, which are sequentially arranged. The first display area and/or the second display area may be flexible. The second driver corresponds to the fourth display area, provides a first data voltage through the second line to the first display area during a first period, and provides a fourth data voltage to the fourth display area during a second period immediately following the first period. The first driver corresponds to the third display area, provides a second data voltage through the first line to the second display area during the second period, and provides a third data voltage to the third display area during the first period.

23 Claims, 19 Drawing Sheets

DISPLAY DEVICE

CROSS-REFERENCE TO RELATED APPLICATION

This application claims priority to Korean Patent Application No. 10-2021-0102030 filed on Aug. 3, 2021 in the Korean Intellectual Property Office; the Korean Patent Application is incorporated by reference.

BACKGROUND

1. Technical Field

The technical field relates to a display device.

2. Description of the Related Art

Display devices may display images according to input signals. Display devices are included in various electronic devices, such as smartphones, digital cameras, laptop computers, navigation devices, and smart televisions. Modern display devices include liquid crystal display devices, field emission display devices, and organic light emitting display devices.

A display device may include display drivers for controlling display elements. There may be design restrictions and costs associated with the display drivers.

SUMMARY

According to an embodiment, a display device comprises a display panel comprising first and second display areas corresponding to a second-type area and adjacent to each other, and third and fourth display areas corresponding to a first-type area and disposed on one side of the second display area, and first and second display drivers disposed to respectively correspond to the third and fourth display areas. The first display area receives a data voltage from the second display driver through a connection line passing through the first to fourth display areas during a first period. The second display area receives a data voltage from the first display driver through a connection line passing through the second and third display areas during a second period immediately after the first period. The third display area receives a data voltage from the first display driver during the first period. The fourth display area receives a data voltage from the second display driver during the second period.

The first display driver may have an output mapping in a forward direction during the first period, and the second display driver may have an output mapping in a reverse direction opposite to the forward direction during the first period.

The first display driver may have the output mapping in the reverse direction during the second period, and the second display driver may have the output mapping in the forward direction during the second period.

The display device may further comprise a demultiplexer disposed between the third and fourth display areas and the first and second display drivers to divide and output respective outputs of the first and second display drivers during the first and second periods.

The demultiplexer may comprise a first switching element configured to electrically connect the third display area to the first display driver during the first period, a second switching element configured to electrically connect a connection line connected to the second display area to the first display driver during the second period, a third switching element configured to electrically connect a connection line connected to the first display area to the second display driver during the first period, and a fourth switching element configured to electrically connect the fourth display area to the second display driver during the second period.

A connection line connected to the second display area may comprise a first portion connected to the second switching element and extending in a first direction in the third display area, a second portion bent from the first portion and extending in a second direction crossing the first direction, and a third portion bent from the second portion and extending in a direction opposite to the first direction in the second display area.

A connection line connected to the first display area may comprise a first portion connected to the third switching element and extending in a first direction in the fourth display area, a second portion bent from the first portion and extending in a second direction crossing the first direction, and a third portion bent from the second portion and extending in a direction opposite to the first direction in the first display area.

The display panel further may comprise fifth and sixth display areas corresponding to the first-type area and disposed on one side of the fourth display area, and seventh and eighth display areas corresponding to the second-type area and disposed on one side of the sixth display area. The display device may further comprise third and fourth display drivers disposed to respectively correspond to the fifth and sixth display areas.

The fifth display area may receive a data voltage from the third display driver during the first period. The sixth display area may receive a data voltage from the fourth display driver during the second period. The seventh display area may receive a data voltage from the fourth display driver through a connection line passing through the sixth and seventh display areas during the first period. The eighth display area may receive a data voltage from the third display driver through a connection line passing through the fifth to eighth display areas during the second period.

The third display driver may have an output mapping in a forward direction during the first period, and the fourth display driver may have an output mapping in a reverse direction opposite to the forward direction during the first period.

The third display driver may have the output mapping in the reverse direction during the second period, and the fourth display driver may have the output mapping in the forward direction during the second period.

The display panel may further comprise a fifth display area corresponding to the first-type area and disposed on one side of the fourth display area, and a sixth display area corresponding to the second-type area and disposed on one side of the fifth display area. The display device may further comprise a third display driver disposed to correspond to the fifth display area.

The fifth display area may receive a data voltage from the third display driver during the first period. The sixth display area may receive a data voltage from the third display driver during the second period.

The third display driver may have an output mapping in a forward direction during the first period and may have an output mapping in a reverse direction opposite to the forward direction during the second period.

According to an embodiment, a display device comprises a display panel comprising first to third display areas corresponding to a second-type area and sequentially arranged, and fourth to sixth display areas corresponding to a first-type area and sequentially arranged on one side of the third display area, and first to third display drivers disposed to respectively correspond to the fourth and sixth display areas. The first display area receives a data voltage from the third display driver during a first period, and the second display area receives a data voltage from the second display driver during a second period immediately after the first period. The third display area receives a data voltage from the first display driver during the first period, and the fourth display area receives a data voltage from the first display driver during the second period. The fifth display area receives a data voltage from the second display driver during the first period, and the sixth display area receives a data voltage from the third display driver during the second period.

The display panel may comprise a first connection line disposed in the third and fourth display areas to electrically connect the third display area to the first display driver, a second connection line disposed in the second to fifth display areas to electrically connect the second display area to the second display driver, and a third connection line disposed in the first to sixth display areas to electrically connect the first display area to the third display driver.

The display device may further comprise a demultiplexer disposed between the fourth to sixth display areas and the first to third display drivers to divide and output respective outputs of the first to third display drivers during the first and second periods.

The demultiplexer may comprise a first switching element configured to electrically connect the first connection line to the first display driver during the first period, a second switching element configured to electrically connect the fourth display area to the first display driver during the second period, a third switching element configured to electrically connect the fifth display area to the second display driver during the first period, and a fourth switching element configured to electrically connect the second connection line to the second display driver during the second period.

According to an embodiment, a display device comprises a display panel comprising first and second display areas corresponding to a second-type area and adjacent to each other, and third and fourth display areas corresponding to a first-type area and disposed on one side of the second display area.

The display device comprises first and second display drivers disposed to respectively correspond to the third and fourth display areas, and a demultiplexer disposed between the third and fourth display areas and the first and second display drivers to divide and output respective outputs of the first and second display drivers during the first and second periods. The demultiplexer connects the first display driver to the third display area and connects the second display driver to the first display area during a first period. The demultiplexer connects the first display driver to the second display area and connects the second display driver to the fourth display area during a second period immediately after the first period.

The first display driver may have an output mapping in a forward direction during the first period, and the second display driver may have an output mapping in a reverse direction opposite to the forward direction during the first period.

The first display driver may have the output mapping in the reverse direction during the second period, and the second display driver may have the output mapping in the forward direction during the second period.

The display panel may comprise a first connection line disposed in the second and third display areas to electrically connect the second display area to the first display driver, and a second connection line disposed in the first to fourth display areas to electrically connect the first display area to the second display driver.

The demultiplexer may comprise a first switching element configured to electrically connect the third display area to the first display driver during the first period, a second switching element configured to electrically connect the first connection line to the first display driver during the second period, a third switching element configured to electrically connect the second connection line to the second display driver during the first period, and a fourth switching element configured to electrically connect the fourth display area to the second display driver during the second period.

An embodiment may be related to a display device. The display device may include a display panel, a first connection, a second connection line, a first display driver, and a second display driver. The display panel may include a first display area, a second display area, a third display, and a fourth display area, which may be sequentially arranged. The second display area may abut the first display area. The third display area may abut the second display area. The fourth display area may abut the third display area. At least one of the first display area and the second display area may be flexible. The first connection line may overlap with each of the second display area and the third display area (and may be spaced from each of the first display area and the fourth display area) in a plan view of the display device. The second connection line may overlap with each of the first display area, the second display area, the third display area, and the fourth display area in the plan view of the display device. The second display driver may be disposed closer to the fourth display area than to the first display area, may provide a first data voltage through the second connection line to the first display area during a first period, and may provide a fourth data voltage to the fourth display area during a second period immediately following the first period. The first display driver may be disposed closer to the third display area than to the second display area, may provide a second data voltage through the first connection line to the second display area during the second period, and may provide a third data voltage to the third display area during the first period.

The first display driver may have an output mapping in a forward direction during the first period, and the second display driver may have an output mapping in a reverse direction opposite to the forward direction during the first period.

The first display driver may have an output mapping in the reverse direction during the second period, and the second display driver may have an output mapping in the forward direction during the second period.

The display device may include a demultiplexer. The demultiplexer may be disposed between the third display area and the first display driver, may be disposed between the fourth display area and the second display drivers, and may divide and output outputs of the first display driver and the second display driver during the first period and the second period.

The demultiplexer may include the following elements: a first switching element configured to electrically connect the third display area to the first display driver during the first period; a second switching element configured to electrically connect the first connection line to the first display driver during the second period; a third switching element configured to electrically connect the second connection line to the second display driver during the first period; and a fourth switching element configured to electrically connect the fourth display area to the second display driver during the second period.

The first connection line may include the following sections: a first section extending lengthwise in a first direction in the third display area; a second section extending lengthwise in a second direction different from the first direction and electrically connected through the first section to the second switching element; and a third section electrically connected through the second section to the first section and extending lengthwise parallel to the first section in the second display area.

The second connection line may include the following sections: a first section extending lengthwise in a first direction in the fourth display area; a second section extending in a second direction different from the first direction and electrically connected through the first section to the third switching element; and a third section electrically connected through the second section to the first section and extending lengthwise parallel to the first section in the first display area.

The display device may include a third display driver and a fourth display driver. The display panel further may include the following display areas: a fifth display area abutting the fourth display area and disposed closer to the third display driver than to the fourth display driver; a sixth display area abutting the fifth display area and disposed closer to the fourth display driver than to the third display driver; a seventh display area abutting the sixth display area; and an eighth display area abutting the seventh display area. At least one of the seventh display area and the eighth display area may be flexible.

The display device may include the following elements: a third connection line overlapping with each of the fifth display area, the sixth display area, the seventh display area, and the eighth display area; and a fourth connection line overlapping with each of the sixth display area and the seventh display area (and spaced from each of the fifth display area and the eighth display area). The fifth display area receives a fifth data voltage from the third display driver during the first period, the sixth display area receives a sixth data voltage from the fourth display driver during the second period, the seventh display area receives a seventh data voltage from the fourth display driver through the fourth connection line during the first period, and the eighth display area receives an eighth data voltage from the third display driver through the third connection line during the second period.

The third display driver may have an output mapping in a forward direction during the first period, and the fourth display driver may have an output mapping in a reverse direction opposite to the forward direction during the first period.

The third display driver may have an output mapping in the reverse direction during the second period, and the fourth display driver may have an output mapping in the forward direction during the second period.

The display device may include a third display driver. The display panel may include the following display areas: a fifth display abutting the fourth display area and disposed closer to the third display driver than to the second display driver; and a sixth display area abutting the fifth display area, disposed farther from the third display deriver than the fifth display area, and being flexible.

The fifth display area may receive a fifth data voltage from the third display driver during the first period, and the sixth display area may receive a sixth data voltage from the third display driver during the second period.

The third display driver may have an output mapping in a forward direction during the first period and may have an output mapping in a reverse direction opposite to the forward direction during the second period.

An embodiment may be related to a display device. The display device may include the following elements a display panel, a first display driver, a second display driver, and a third display driver. The display panel may include a first display area, a second display area, a third display area, a fourth display area, a fifth display area, and a sixth display area. The second display area may abut the first display area. The third display area may abut the second display area. The fourth display area may abut the third display area. The fifth display area may abut the fourth display area. The sixth display area may abut the fifth display area. At least one of the first display area, the second display area, and the third display area may be flexible. The first display driver may be positioned closer to the fourth display area than to the fifth display area. The second display driver may be disposed closer to the fifth display area than to each of the fourth display area and the sixth display area. The third display driver may be disposed closer to the fourth and sixth display area than to the fifth display area. The first display area may receive a first data voltage from the third display driver during a first period, the second display area may receive a second data voltage from the second display driver during a second period immediately following the first period, the third display area may receive a third data voltage from the first display driver during the first period, the fourth display area may receive a fourth data voltage from the first display driver during the second period, the fifth display area may receive a fifth data voltage from the second display driver during the first period, and the sixth display area may receive a sixth data voltage from the third display driver during the second period.

The display device may include the following elements: a first connection line disposed in the third display area and the fourth display area for electrically connecting the third display area to the first display driver; a second connection line disposed in the second display area, the third display area, the fourth display area, and the fifth display area for electrically connecting the second display area to the second display driver; and a third connection line disposed in the first display area, the second display area, the third display area, the fourth display area, the fifth display area, and the sixth display area for electrically connecting the first display area to the third display driver.

The display device may include a demultiplexer. The demultiplexer may be disposed between the fourth display area and the first display driver, may be disposed between the fifth display area and the second display driver, may be disposed between the sixth display area and the third display driver, and may divide and output outputs of the first display driver, the second display driver, and the third display drivers during the first period and the second period.

The demultiplexer may include the following elements: a first switching element configured to electrically connect the first connection line to the first display driver during the first period; a second switching element configured to electrically connect the fourth display area to the first display driver during the second period; a third switching element configured to electrically connect the fifth display area to the second display driver during the first period; and a fourth switching element configured to electrically connect the second connection line to the second display driver during the second period.

An embodiment may be related to a display device. The display device may include a display panel, a first display deriver, a second display driver, and a demultiplexer. The display panel may include a first display area, a second display area, a third display area, and fourth display, which may be sequentially arranged. The second display area may abut the first display area. The third display area may abut the second display area. The fourth display area may abut the third display area. At least one of the first display area and the second display area may be flexible. The first display driver may be disposed closer to the third display area than to the fourth display area. The second display driver may be disposed closer to the fourth display area than to the third display area. The demultiplexer may be disposed between the third display area and the first display driver, may be disposed between the fourth display area and the second display driver, may electrically connect the first display driver to the third display area during a first period, may electrically connect the second display driver to the first display area during the first period, may electrically connect the first display driver to the second display area during a second period immediately following the first period, and may electrically connect the second display driver to the fourth display area during the second period.

The first display driver may have an output mapping in a forward direction during the first period, and the second display driver may have an output mapping in a reverse direction opposite to the forward direction during the first period.

The first display driver may have an output mapping in the reverse direction during the second period, and the second display driver may have an output mapping in the forward direction during the second period.

The display device may include the following elements: a first connection line disposed in the second display area and the third display area for electrically connecting the second display area to the first display driver; and a second connection line disposed in the first display area, the second display area, the third display area, and the fourth display area for electrically connecting the first display area to the second display driver.

According to embodiments, a display device may include a display panel and drivers. The display panel may include one or more first-type areas corresponding to display drivers and may include one or more second-type areas free from structural restrictions of display drivers. The display drivers may be standardized display drivers. According to the design of the display panel, the output mapping directions of the display drivers during different time periods may be suitably configured. Advantageously, design freedom associated with the display device may be maximized, and/or costs associated with the display device may be minimized.

DETAILED DESCRIPTION OF EMBODIMENTS

Figure 1:
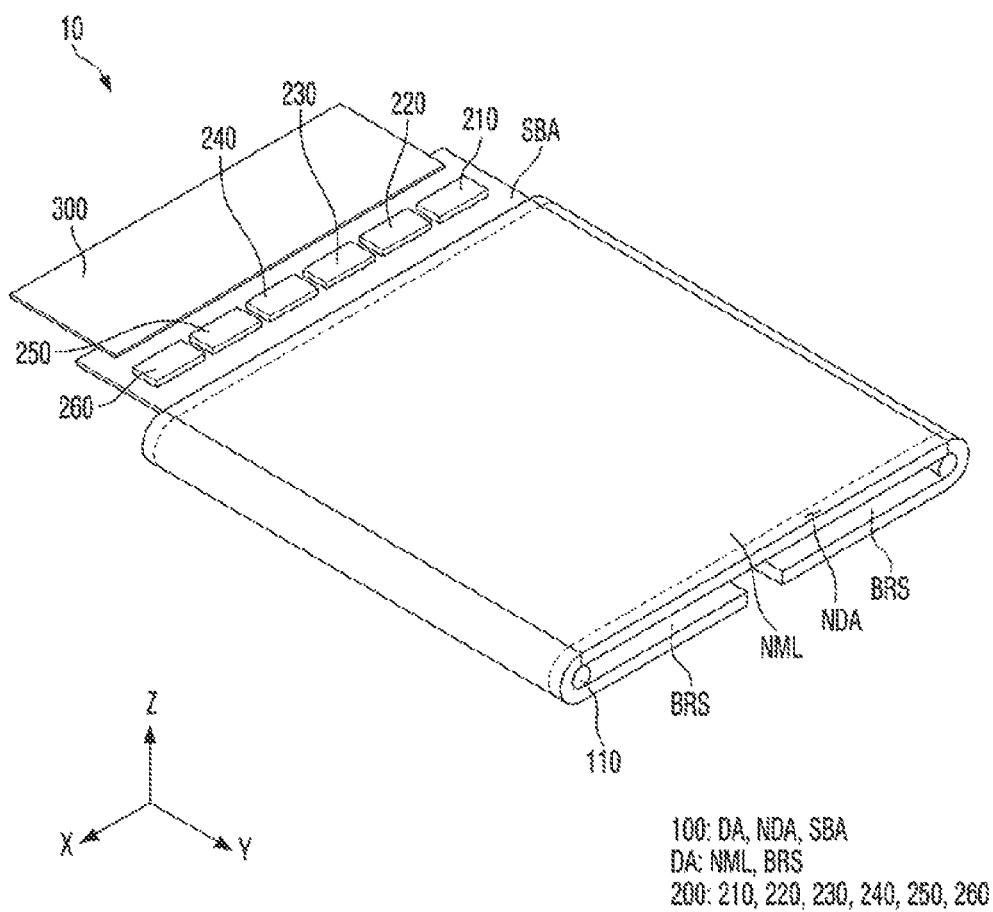
FIG. 1 is a perspective view illustrating a first state of a display device according to one embodiment.

Examples of embodiments are described with reference to the accompanying drawings. In the accompanying drawings, dimensions may be exaggerated for clarity and/or descriptive purposes. Like reference numerals may denote like elements.

When an embodiment may be implemented differently, a specific process order may be performed differently from the described order. For example, two consecutively described processes may be performed substantially at the same time or performed in an order opposite to the described order.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

When a first element is referred to as being "on," "connected to," or "coupled to" a second element, the first element may be directly on, connected to, or coupled to the second element, or one or more intervening elements may be present between the first element and the second element. When a first element is referred to as being "directly on," "directly connected to," or "directly coupled to" a second element, there are no intervening elements (except for environment elements such as air) present or connected between the first element and the second element.

The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be made of." The term "adjacent" may mean "immediately adjacent." The expression that an element extends in a particular direction may mean that the element extends lengthwise in the particular direction and/or that the lengthwise direction of the element is in the particular direction. The term "pattern" may mean "member." The term "define" may mean "form" or "provide." The expression that a first element overlaps with a second element in a plan view may mean that the first element overlaps the second element in direction perpendicular to a substrate. The term "overlap" may be equivalent to "be overlapped by." The term "odd" may mean "odd-numbered." The term "even" may mean "even-numbered." The term "during" may mean "for." The term "portion" may mean "section."

Spatially relative terms, such as "beneath," "below," "under," "lower," "above," "upper," "over," "higher," "side" (e.g., as in "sidewall"), and the like, may be used to describe structural relationships between elements illustrated in the drawings. Spatially relative terms are intended to encompass different orientations of an apparatus in use, operation, storage, and/or manufacturing in addition to the orientations depicted in the drawings. For example, if the apparatus in the drawings is turned over, elements described as "below" or "beneath" other elements or features would then be oriented "above" the other elements or features. The apparatus may be otherwise oriented (e.g., rotated 90 degrees or at other orientations), and the spatially relative descriptors used herein should be interpreted accordingly.

The singular forms, "a," "an," and "the" may indicate the plural forms as well, unless the context clearly indicates otherwise. The terms "comprises," "comprising," "includes," and/or "including" may specify the presence of stated features, but may not preclude the presence or addition of one or more other features.

Variations from the illustrated shapes in the drawings as a result, for example, of manufacturing techniques and/or tolerances, are to be expected. The described embodiments should not be construed as limited to the particular illustrated shapes.

Figure 2:
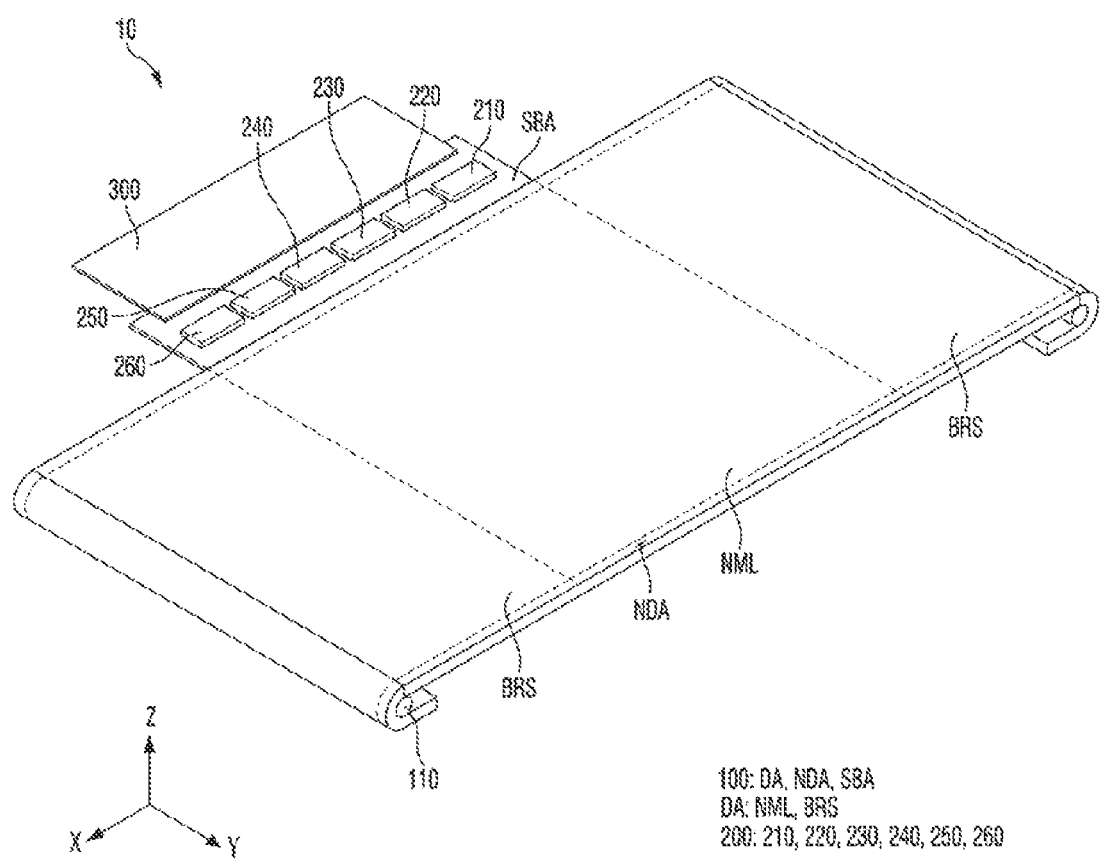
FIG. 2 is a perspective view illustrating a second state of the display device according to one embodiment.
Figure 3:
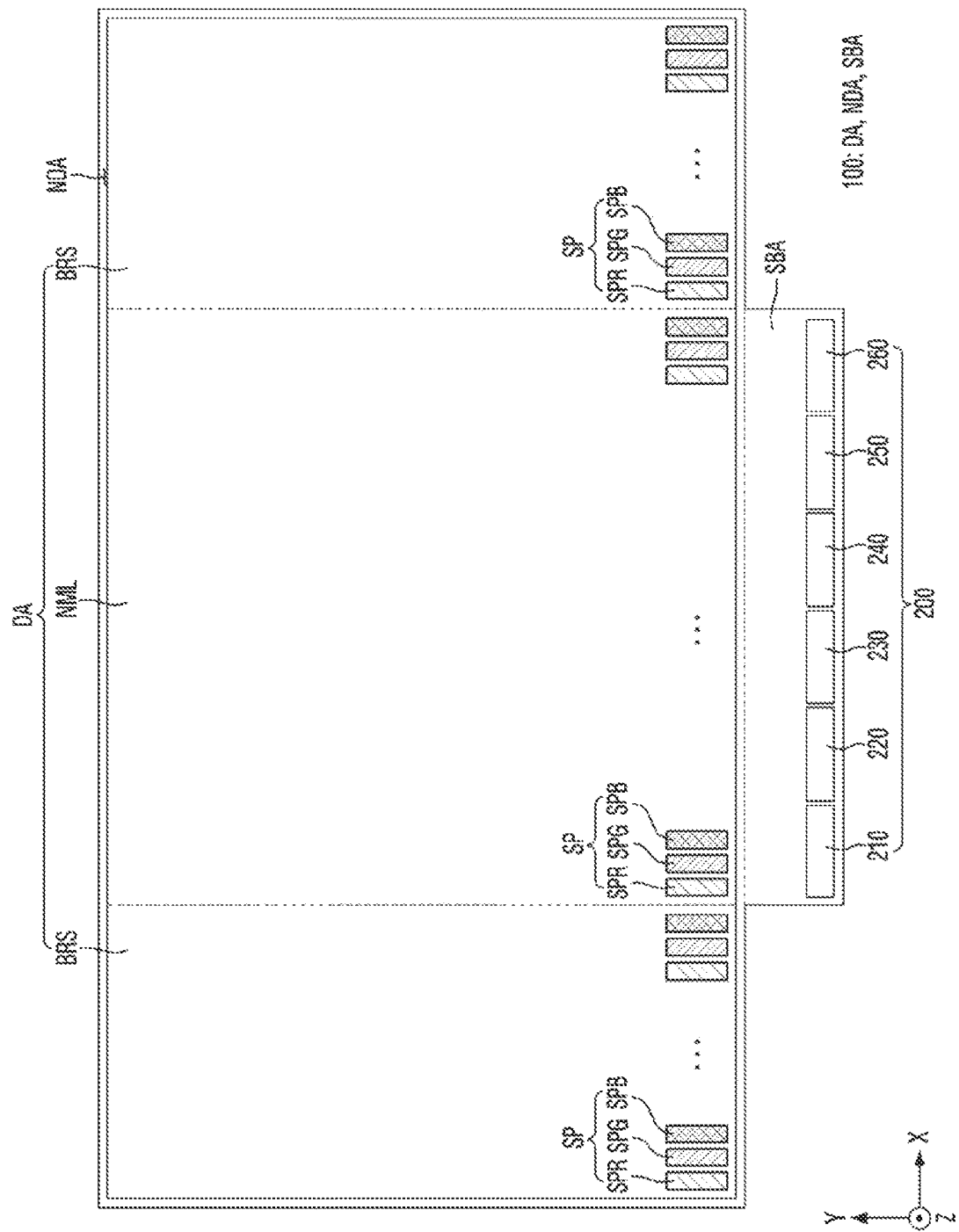
FIG. 3 is a plan view showing a display device according to one embodiment.

FIG. 1 is a perspective view illustrating a first state of a display device 10 according to one embodiment, and FIG. 2 is a perspective view illustrating a second state of the display device 10 according to one embodiment. FIG. 3 is a plan view showing the display device 10 according to one embodiment.

The display device 10 may be applied to an electronic device, such as a mobile phone, a smartphone, a tablet personal computer, a mobile communication terminal, an electronic organizer, an electronic book, a portable multimedia player (PMP), a navigation system, an ultra-mobile PC (UMPC), a television, a laptop, a monitor, a billboard, an Internet-of-Things (IoT) device, a smart watch, a watch phone, a glasses type display, or a head mounted display (HMD).

The display device 10 may include a display panel 100, a display driver 200, and a circuit board 300. The display panel 100 may include a display area DA (or combined display area DA), a non-display area NDA, and a region SBA.

The display area DA may include a plurality of pixels SP for displaying an image. The plurality of pixels SP may include a red pixel SPR, a green pixel SPG, and a blue pixel SPB. Each of the red pixel SPR, the green pixel SPG, and the blue pixel SPB may emit light from an emission area or opening area. The display panel 100 may include a pixel circuit including switching elements, a pixel defining layer defining the emission area or opening area, and a self-light emitting element.

The self-light emitting element may include an organic light emitting diode including an organic light emitting layer, a quantum dot light emitting diode including a quantum dot light emitting layer, or an inorganic light emitting diode including an inorganic semiconductor.

The display area DA may include a first-type area NML and a second-type area BRS. The first-type area NML may correspond to the display driver 200. The display driver 200 may be disposed in the region SBA extending from the lower side of the first-type area NML.

The second-type area BRS may be disposed on one or more sides of the first-type area NML. The second-type area BRS may not correspond to the display driver 200. The display driver 200 may not be disposed on the lower side of the second-type area BRS. The second-type area BRS may include a flexible material capable of bending, folding, sliding, or rolling. The second-type area BRS may be bent, folded, slid, or rolled to overlap the first-type area NML in the thickness direction (Z-axis direction).

In FIGS. 1 and 2, the second-type area BRS may have a first state or a second state. In the first state, the second-type area BRS slides under the first-type area NML to overlap the first-type area NML, so that the second-type area BRS is not visually recognized from the front of the display device 10. In the second state, the second-type area BRS (after sliding using a roller 110) is visually recognized from the front of the display device 10. The display device 10 may be implemented in various uses, sizes, and shapes with the second-type area BRS being free from structural constraints of the display driver 200.

The non-display area NDA may be outside the display area DA. The non-display area NDA may surround the display area DA. The non-display area NDA may include a gate driver (not illustrated) that supplies gate signals to the gate lines, and may include fan-out lines disposed between the display driver 200 and the first-type area NML.

The region SBA may extend from a side of the first-type area NML. The region SBA may include a flexible material which can be bent, folded or rolled. When the region SBA is bent, the region SBA may overlap the first-type area NML in the thickness direction (Z-axis direction). The region SBA may include the display driver 200 and the pad unit connected to the circuit board 300. The region SBA may be optional, and the display driver 200 and the pad unit may be arranged in the non-display area NDA.

The display driver 200 may output signals and voltages for driving the display panel 100. The display driver 200 may supply data voltages to data lines. The display driver 200 may supply a power voltage to the power line and may supply a gate control signal to the gate driver. The display driver 200 may be an integrated circuit (IC) and mounted on the display panel 100 by a chip on glass (COG) method, a chip on plastic (COP) method, or an ultrasonic bonding method. The display driver 200 may be disposed in the region SBA, and may overlap the first-type area NML in the thickness direction (Z-axis direction) after the region SBA has been bent relative to the first-type area NML. The display driver 200 may be mounted on the circuit board 300.

The display driver 200 may include first to sixth display drivers 210 to 260. Each of the first to sixth display drivers 210 to 260 may supply a data voltage to the first-type area NML and the second-type area BRS. In FIGS. 1 to 3, the display device 10 may include six display drivers 200, but the number of display drivers 200 is not limited, and the design may be changed according to the structure of the display panel 100.

The circuit board 300 may be attached to the pad unit of the display panel 100 by an anisotropic conductive film (ACF). Lead lines of the circuit board 300 may be electrically connected to a pad unit of the display panel 100. The circuit board 300 may be a flexible printed circuit board, a printed circuit board, or a flexible film such as a chip on film.

Figure 4:
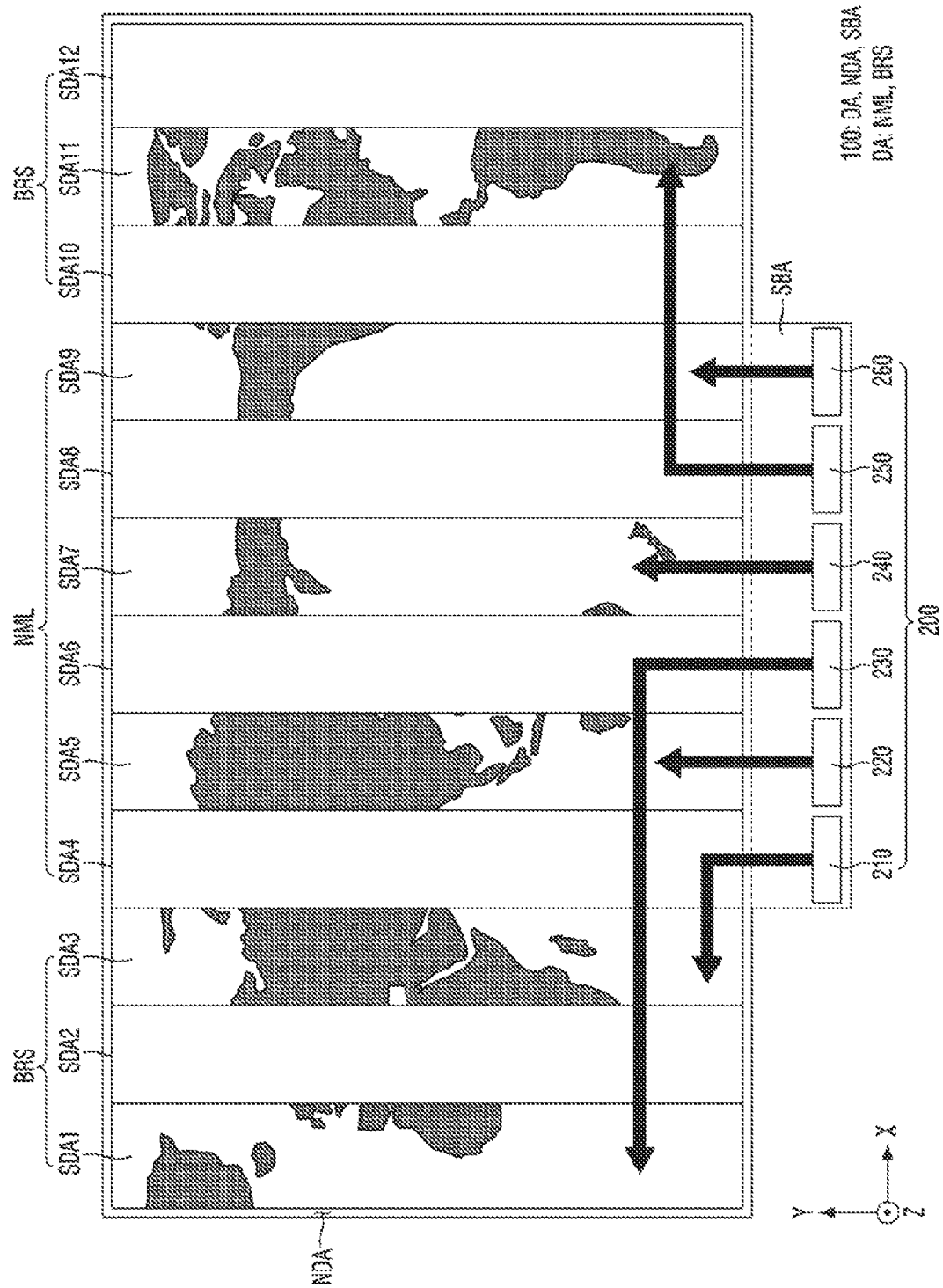
FIG. 4 is a plan view illustrating a display state of a display device in a first period according to one embodiment.
Figure 5:
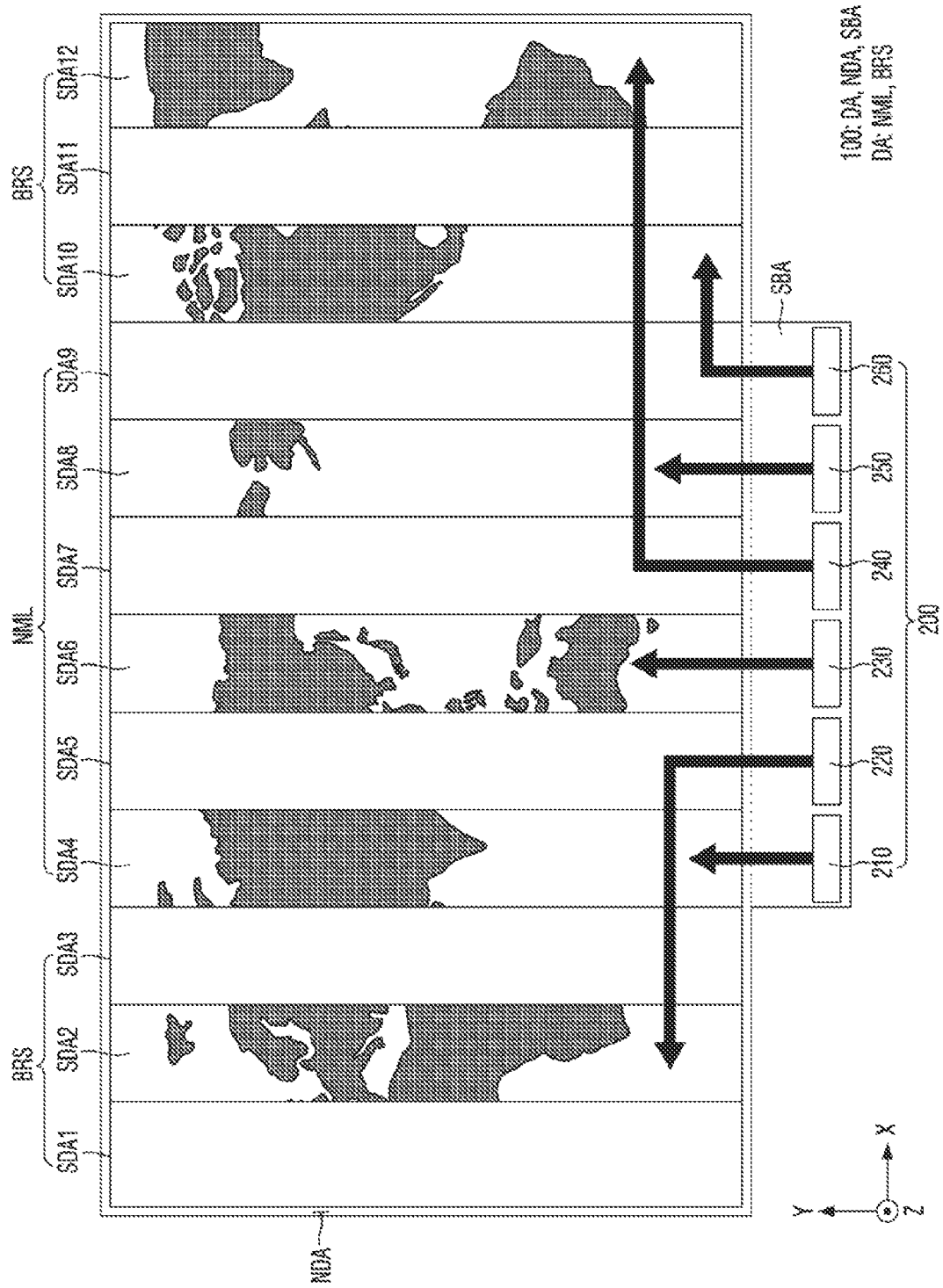
FIG. 5 is a plan view illustrating a display state of a display device in a second period according to one embodiment.

FIG. 4 is a plan view illustrating a display state of a display device in a first period according to one embodiment, and FIG. 5 is a plan view illustrating a display state of the display device in a second period according to one embodiment.

Referring to FIGS. 4 and 5, the display area DA may include first to twelfth display areas SDA1 to SDA12. The first to twelfth display areas SDA1 to SDA12 may be sequentially disposed along the first direction (X-axis direction). The fourth to ninth display areas SDA4, SDA5, SDA6, SDA7, SDA8, and SDA9 may correspond to (and/or constitute) the first-type area NML. The fourth to ninth display areas SDA4, SDA5, SDA6, SDA7, SDA8, and SDA9 may correspond to (and be aligned with) the first to sixth display drivers 210, 220, 230, 240, 250, and 260, respectively. The fourth display area SDA4 may be disposed closest to the first display driver 210 of the display driver 200, and may receive a data voltage from the first display driver 210.

The first to third display areas SDA1, SDA2, and SDA3 and the tenth to twelfth display areas SDA10, SDA11, and SDA12 may correspond to (and constitute) the second-type area BRS. The first to third display areas SDA1, SDA2, and SDA3 may extend from the left side of the first-type area NML, and the tenth to twelfth display areas SDA10, SDA11, and SDA12 may extend from the right side of the first-type area NML. The second-type area BRS may not be directly connected to the display driver 200, and may be electrically connected to the display driver 200 through a connection line passing through the first-type area NML.

In FIG. 4, each display area disposed in an odd-numbered position (hereinafter, an odd display area) among the first to twelfth display areas SDA1 to SDA12 may receive a data voltage from the display driver 200 during the first period of the output period of the display driver 200 and may display an image. The output period of the display driver 200 may correspond to a horizontal synchronization signal. The first display area SDA1 may receive a data voltage from the third display driver 230 through a bent connection line. The third display area SDA3 may receive a data voltage from the first display driver 210 through a bent connection line. The fifth display area SDA5 may receive a data voltage directly from the second display driver 220 or through a straight connection line. The seventh display area SDA7 may receive a data voltage directly from the fourth display driver 240 or through a straight connection line. The ninth display area SDA9 may receive a data voltage directly from the sixth display driver 260 or through a straight connection line. The eleventh display area SDA11 may receive a data voltage from the fifth display driver 250 through a bent connection line.

In FIG. 5, each display area disposed in an even-numbered position (hereinafter, an even display area) among the first to twelfth display areas SDA1 to SDA12 may receive a data voltage from the display driver 200 during the second period immediately following the first period of the output period of the display driver 200 and may display an image. The second display area SDA2 may receive a data voltage from the second display driver 220 through a bent connection line. The fourth display area SDA4 may receive a data voltage directly from the first display driver 210 or from a straight connection line. The sixth display area SDA6 may receive a data voltage directly from the third display driver 230 or through a straight connection line. The eighth display area SDA8 may receive a data voltage directly from the fifth display driver 250 or through a straight connection line. The tenth display area SDA10 may receive a data voltage from the sixth display driver 260 through a bent connection line. The twelfth display area SDA12 may receive a data voltage from the fourth display driver 240 through a bent connection line.

The first-type area NML may receive the data voltages directly from the display driver 200 or through straight connection lines, and the second-type area BRS may receive the data voltages through bent connection lines passing through the first-type area NML. The display device 10 may drive the odd display area and the even display area by performing time division driving. The display device 10 may include a smaller number of display drivers 200 than the number of display areas. The display device 10 may improve design freedom and reduce costs by including the second-type area BRS free from structural constraints of the display driver 200.

Figure 6:
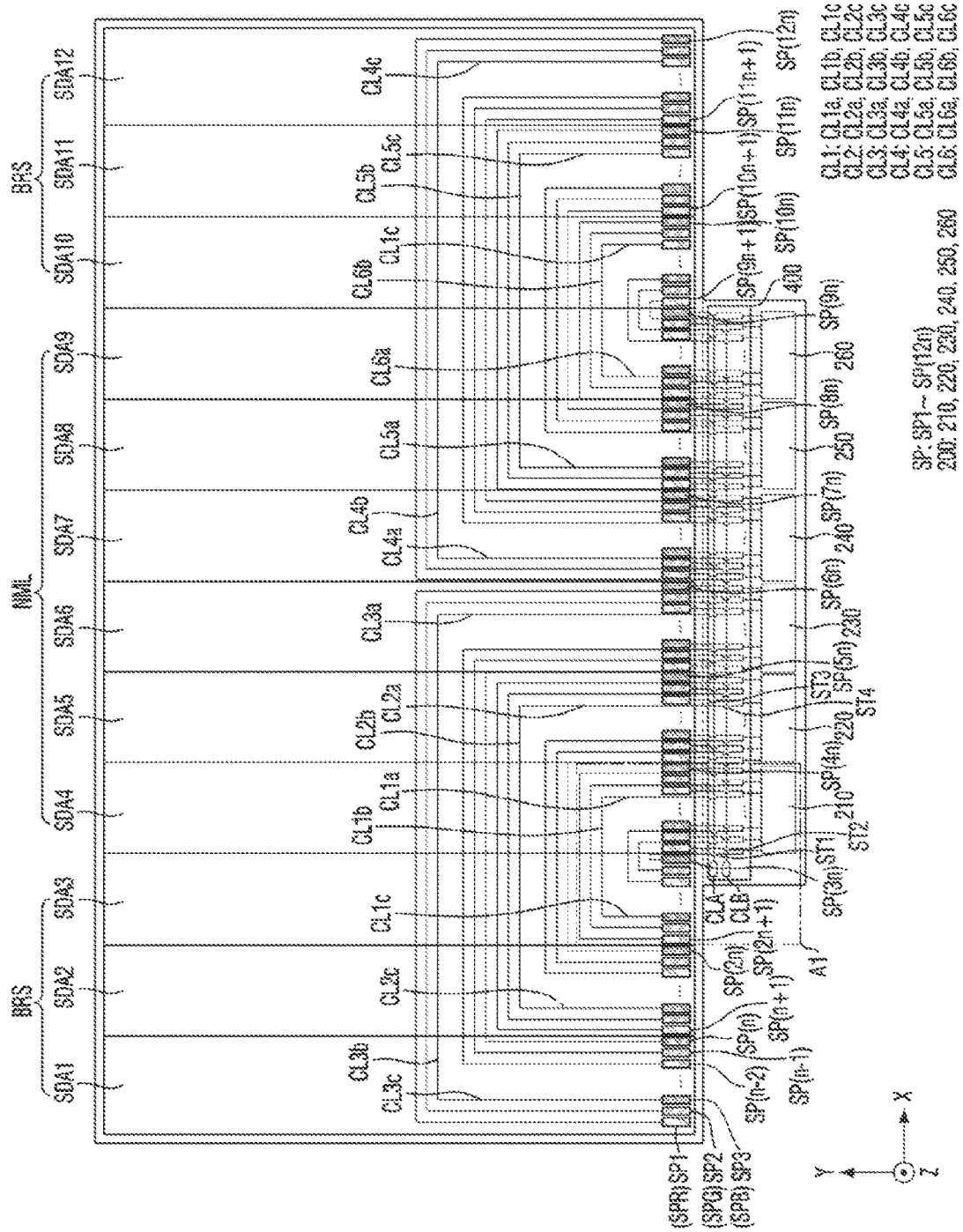
FIG. 6 is a plan view illustrating a plurality of display areas and a plurality of display drivers in a display device according to one embodiment.
Figure 7:
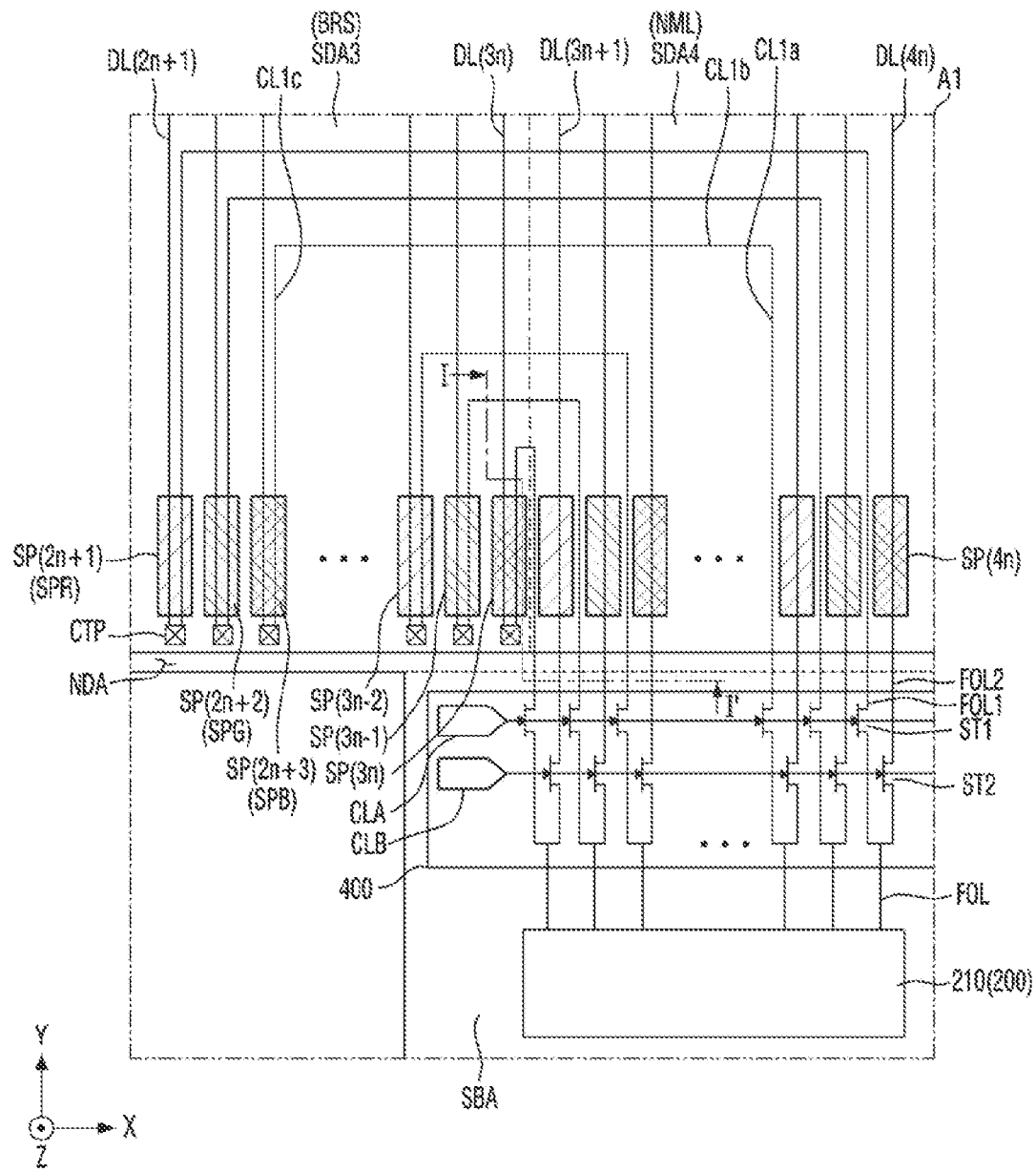
FIG. 7 is illustrates area A1 of FIG. 6 according to one embodiment.
Figure 8:
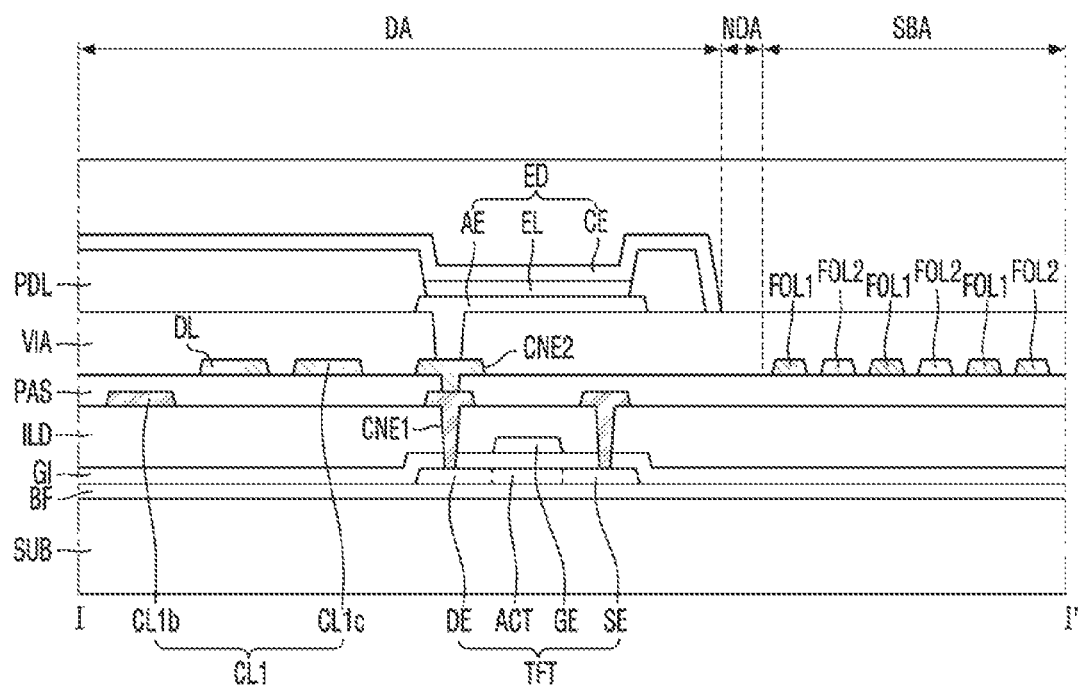
FIG. 8 is a cross-sectional view taken along line I-I' of FIG. 7 according to one embodiment.
Figure 9:
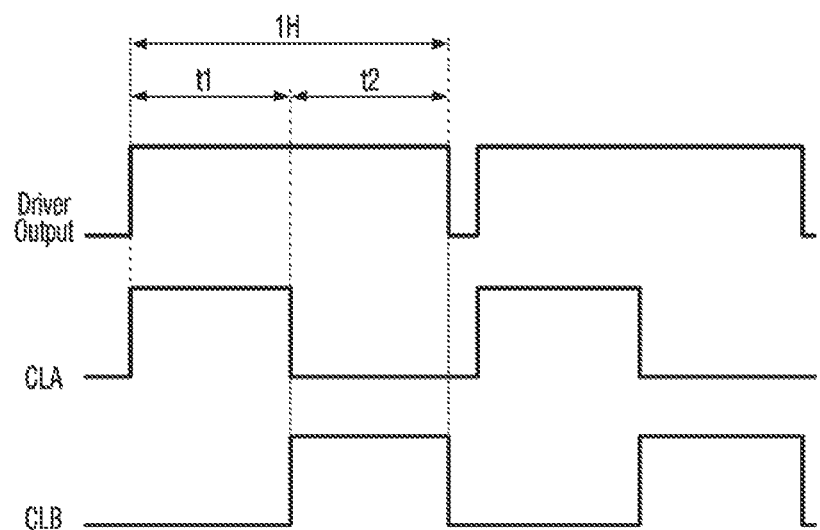
FIG. 9 is a waveform diagram illustrating first and second clock signals in a display device according to one embodiment.

FIG. 6 is a view illustrating a plurality of display areas and a plurality of display drivers in a display device according to one embodiment. FIG. 7 illustrates area A1 of FIG. 6 according to one embodiment. FIG. 8 is a cross-sectional view taken along line I-I' of FIG. 7. FIG. 9 is a waveform diagram illustrating first and second clock signals in a display device according to one embodiment.

Referring to FIGS. 6 to 9, the display area DA may include the first to twelfth display areas SDA1 to SDA12. Each of the first to twelfth display areas SDA1 to SDA12 may include the plurality of pixels SP arranged in n pixel columns (n is a positive integer). The n may be 1920, but n may be increased or decreased according to the resolution of the display device. The first display area SDA1 may include first to $n^{th}$ pixels SP1, SP2, and SP3 to SP(n−2), SP(n−1), and SP(n). The second display area SDA2 may include pixels SP(n+1) to SP(2n). The third display area SDA3 may include pixels SP(2n+1) to SP(3n). The display areas SDA4, SDA5, SDA6, SDA7, SDA8, and SDA9 may respectively include pixels SP(4n), SP(5n). SP(6n), SP(7n), SP(8n), and SP(9n). The tenth display area SDA10 may include pixels SP(9n+1) to SP(10n). The eleventh display area SDA11 may include pixels SP(10n+1) to SP(11n). The twelfth display area SDA12 may include $(11n+1)^{th}$ to $(12n)^{th}$ pixels SP(11n+1) to SP(12n).

The display area DA may include first to sixth connection lines CL1 to CL6.

The first connection line CL1 may electrically connect the first display driver 210 to the third display area SDA3. The first connection line CL1 may be disposed in the third and fourth display areas SDA3 and SDA4 to extend to the second-type area BRS via the first-type area NML. The first connection line CL1 may include first to third portions CL1*a*, CL1*b*, and CL1*c*. The first portion CL1*a* of the first connection line CL1 may be connected to a first switching element ST1 of the demultiplexer 400, and may extend in the second direction (Y-axis direction) in the fourth display area SDA4. The second portion CL1*b* of the first connection line CL1 may be bent from the first portion CL1*a* and extend in a direction opposite to the first direction (X-axis direction). The second portion CL1*b* of the first connection line CL1 may extend from the fourth display area SDA4 to the third display area SDA3. The third portion CL1*c* of the first connection line CL1 may be bent from the second portion CL1*b* and extend in a direction opposite to the second direction (Y-axis direction). Referring to FIG. 7, the third portion CL1*c* of the first connection line CL1 may be connected to one or more of the data lines DL(2*n*+1) to DL(3*n*) provided in the third display area SDA3 through one or more of the contact pads CTP disposed on the lower side of the third display area SDA3.

The second connection line CL2 may electrically connect the second display driver 220 to the second display area SDA2. The second connection line CL2 may be disposed in the second to fifth display areas SDA2, SDA3, SDA4, and SDA5 to extend to the second-type area BRS via the first-type area NML. The second connection line CL2 may reduce the complexity of the lines of the display panel 100 by bypassing the first connection line CL1. The second connection line CL2 may include first to third portions CL2*a*, CL2*b*, and CL2*c*. The first portion CL2*a* of the second connection line CL2 may be connected to a fourth switching element ST4 of the demultiplexer 400, and may extend in the second direction (Y-axis direction) in the fifth display area SDA5. The second portion CL2*b* of the second connection line CL2 may be bent from the first portion CL2*a* and extend in a direction opposite to the first direction (X-axis direction). The second portion CL2*b* of the second connection line CL2 may extend from the fifth display area SDA5 to the second display area SDA2. The third portion CL2*c* of the second connection line CL2 may be bent from the second portion CL2*b* and extend in a direction opposite to the second direction (Y-axis direction). The third portion CL2*c* of the second connection line CL2 may be connected to one or more data lines provided in the second display area SDA2 through one or more contact pads disposed on the lower side of the second display area SDA2.

The third connection line CL3 may electrically connect the third display driver 230 to the first display area SDA1. The third connection line CL3 may be disposed in the first to sixth display areas SDA1, SDA2, SDA3, SDA4, SDA5, and SDA6 to extend to the second-type area BRS via the first-type area NML. The third connection line CL3 may reduce the complexity of the lines of the display panel 100 by bypassing the second connection line CL2. The third connection line CL3 may include first to third portions CL3*a*, CL3*b*, and CL3*c*. The first portion CL3*a* of the third connection line CL3 may be connected to the first switching element ST1 of the demultiplexer 400, and may extend in the second direction (Y-axis direction) in the six display area SDA6. The second portion CL3*b* of the third connection line CL3 may be bent from the first portion CL3*a* and extend in a direction opposite to the first direction (X-axis direction). The second portion CL3*b* of the third connection line CL3 may extend from the sixth display area SDA6 to the first display area SDA1. The third portion CL3*c* of the third connection line CL3 may be bent from the second portion CL3*b* and extend in a direction opposite to the second direction (Y-axis direction). The third portion CL3*c* of the third connection line CL3 may be connected to one or more data lines provided in the first display area SDA1 through one or more contact pads disposed on the lower side of the first display area SDA1.

The fourth connection line CL4 may electrically connect the fourth display driver 240 to the twelfth display area SDA12. The fourth connection line CL4 may be disposed in the seventh to twelfth display areas SDA7, SDA8, SDA9, SDA10, SDA11, and SDA12 to extend to the second-type area BRS via the first-type area NML. The fourth connection line CL4 may reduce the complexity of the lines of the display panel 100 by bypassing the fifth and sixth connection lines CL5 and CL6. The fourth connection line CL4 may include first to third portions CL4*a*, CL4*b*, and CL4*c*. The first portion CL4*a* of the fourth connection line CL4 may be connected to the fourth switching element ST4 of the demultiplexer 400, and may extend in the second direction (Y-axis direction) in the seventh display area SDA7. The second portion CL4*b* of the fourth connection line CL4 may be bent from the first portion CL4*a* and extend in the first direction (X-axis direction). The second portion CL4*b* of the fourth connection line CL4 may extend from the seventh display area SDA7 to the twelfth display area SDA12. The third portion CL4*c* of the fourth connection line CL4 may be bent from the second portion CL4*b* and extend in a direction opposite to the second direction (Y-axis direction). The third portion CL4*c* of the fourth connection line CL4 may be connected to one or more data lines provided in the twelfth display area SDA12 through at least one contact pad disposed on the lower side of the twelfth display area SDA12.

The fifth connection line CL5 may electrically connect the fifth display driver 250 to the eleventh display area SDA11. The fifth connection line CL5 may be disposed in the eighth to eleventh display areas SDA8, SDA9, SDA10, and SDA11 to extend to the second-type area BRS via the first-type area NML. The fifth connection line CL5 may reduce the complexity of the lines of the display panel 100 by bypassing the sixth connection line CL6. The fifth connection line CL5 may include first to third portions CL5*a*, CL5*b*, and CL5*c*. The first portion CL5*a* of the fifth connection line CL5 may be connected to the first switching element ST1 of the demultiplexer 400, and may extend in the second direction (Y-axis direction) in the eighth display area SDA8. The second portion CL5*b* of the fifth connection line CL5 may be bent from the first portion CL5*a* and extend in the first direction (X-axis direction). The second portion CL5*b* of the fifth connection line CL5 may extend from the eighth display area SDA8 to the eleventh display area SDA11. The third portion CL5*c* of the fifth connection line CL5 may be bent from the second portion CL5*b* and extend in a direction opposite to the second direction (Y-axis direction). The third portion CL5*c* of the fifth connection line CL5 may be connected to one or more data lines provided in the eleventh display area SDA11 through at least one contact pad disposed on the lower side of the eleventh display area SDA11.

The sixth connection line CL6 may electrically connect the sixth display driver 260 to the tenth display area SDA10. The sixth connection line CL6 may be disposed in the ninth and tenth display areas SDA9 and SDA10 to extend to the second-type area BRS via the first-type area NML. The sixth connection line CL6 may include first to third portions CL6*a*, CL6*b*, and CL6*c*. The first portion CL6*a* of the sixth connection line CL6 may be connected to the fourth switching element ST4 of the demultiplexer 400, and may extend in the second direction (Y-axis direction) in the ninth display area SDA9. The second portion CL6b of the sixth connection line CL6 may be bent from the first portion CL6a and extend in the first direction (X-axis direction). The second portion CL6b of the sixth connection line CL6 may extend from the ninth display area SDA9 to the tenth display area SDA10. The third portion CL6c of the sixth connection line CL6 may be bent from the second portion CL6b and extend in a direction opposite to the second direction (Y-axis direction). The third portion CL6c of the sixth connection line CL6 may be connected to one or more data lines provided in the tenth display area SDA10 through at least one contact pad disposed on the lower side of the tenth display area SDA10.

The display area DA includes the first to sixth connection lines CL1, CL2, CL3, CL4, CL5 and CL6 extending to the second-type area BRS via the first-type area NML, so that the periphery of the second-type area BRS may be simplified. Advantageously, design freedom may be improved, and costs may be reduced.

In FIG. 8, the display panel 100 may include a substrate SUB, a buffer layer BF, a thin film transistor TFT, a gate insulating layer GI, an interlayer insulating layer ILD, a first connection electrode CNE1, and a first connection line CL1, a passivation layer PAS, a second connection electrode CNE2, a data line DL, first and second fan-out lines FOL1 and FOL2, a via layer VIA, a light emitting element ED, and a pixel defining layer PDL.

The substrate SUB may support other elements of the display device 10. The substrate SUB may be a base substrate or a base member. The substrate SUB may be a flexible substrate which can be bent, folded or rolled. The substrate SUB may include an insulating material such as a polymer resin such as polyimide (PI). The substrate SUB may be a rigid substrate including a glass material.

The buffer layer BF may be disposed on the substrate SUB. The buffer layer BF may be formed of an inorganic film that is capable of preventing air or moisture infiltration. The buffer layer BF may include inorganic layers laminated alternately.

The thin film transistor TFT may be disposed on the buffer layer BF and may be part of a pixel circuit of the pixel SP. The thin film transistor TFT may be a switching transistor or a driving transistor of the pixel circuit. The thin film transistor TFT may include a semiconductor region ACT, a gate electrode GE, a source electrode SE, and a drain electrode DE.

The semiconductor region ACT, the source electrode SE, and the drain electrode DE may be disposed on the buffer layer BF. The semiconductor region ACT may overlap the gate electrode GE in the thickness direction (Z-axis direction), and may be insulated from the gate electrode GE by the gate insulating layer GI. The drain electrode DE and the source electrode SE may be provided by making a material of the semiconductor region ACT conductive.

The gate electrode GE may be disposed on the gate insulating layer GI. The gate electrode GE and the semiconductor region ACT may overlap each other and may be insulated from each other by the intervening gate insulating layer GI.

The gate insulating layer GI may be disposed on the semiconductor region ACT, the drain electrode DE, and the source electrode SE. The gate insulating layer GI may cover the semiconductor region ACT, the drain electrode DE, the source electrode SE, and the buffer layer BF, and may insulate the semiconductor region ACT and the gate electrode GE. The gate insulating layer GI may include a contact hole through which the first connection electrode CNE1 passes.

The interlayer insulating layer ILD may be disposed on the gate electrode GE. The interlayer insulating layer ILD may insulate the first connection electrode CNE1 from the thin film transistor TFT. The interlayer insulating layer ILD may include a contact hole through which the first connection electrode CNE1 passes.

The first connection electrode CNE1 may be disposed on the interlayer insulating layer ILD. The first connection electrode CNE1 may connect the drain electrode DE of the thin film transistor TFT to the second connection electrode CNE2. The first connection electrode CNE1 may be in contact with the drain electrode DE through the contact hole provided in the interlayer insulating layer ILD and the gate insulating layer GI.

The second portion CL1b of the first connection line CL1 may be disposed on the interlayer insulating layer ILD to be spaced apart from the first connection electrode CNE1. The second portion CL1b of the first connection line CL1 may be insulated from the data line DL extending in the second direction (Y-axis direction) on the passivation layer PAS by extending in the first direction (X-axis direction) on the interlayer insulating layer ILD.

The passivation layer PAS may be disposed on the second portion CL1b of the first connection line CL1, the first connection electrode CNE1, and the interlayer insulating layer ILD. The passivation layer PAS may protect the thin film transistor TFT. The passivation layer PAS may include a contact hole through which the second connection electrode CNE2 passes.

The second connection electrode CNE2 may be disposed on the passivation layer PAS. The second connection electrode CNE2 may connect the first connection electrode CNE1 and a first electrode AE of the light emitting element ED. The second connection electrode CNE2 may be in contact with the first connection electrode CNE1 through a contact hole provided in the passivation layer PAS.

The data line DL and the third portion CL1c of the first connection line CL1 may be spaced apart from the second connection electrode CNE2 on the passivation layer PAS. The data line DL and the third portion CL1c of the first connection line CL1 may extend in parallel in the second direction (Y-axis direction) in the third display area SDA3.

The first and second fan-out lines FOL1 and FOL2 may be disposed on the passivation layer PAS. The first and second fan-out lines FOL1 and FOL2 may extend in parallel in the second direction (Y-axis direction) in the region SBA.

The via layer VIA may be provided on the passivation layer PAS to planarize an upper end of the thin film transistor TFT. The via layer VIA may include a contact hole through which the first electrode AE of the light emitting element ED passes. The via layer VIA may contain an organic insulating material such as polyimide (PI).

The light emitting element ED may be provided on the via layer VIA. The light emitting element ED may include the first electrode AE, a light emitting layer EL, and a second electrode CE.

The first electrode AE may be provided on the via layer VIA. The first electrode AE may overlap the emission area or the opening area defined by the pixel defining layer PDL. The first electrode AE may be connected to the drain electrode DE of the thin film transistor TFT through the first and second connection electrodes CNE1 and CNE2.

A light emitting layer EL may be provided on the first electrode AE. The light emitting layer EL may include a hole injection layer, a hole transport layer, an electron blocking layer, an electron transport layer, and an electron injection layer. The light emitting layer EL may be an organic light emitting layer made of an organic material. The thin film transistor TFT may apply a predetermined voltage to the first electrode AE of the light emitting element ED, the second electrode CE of the light emitting element ED may receive a common voltage or a cathode voltage, and holes and electrons can move to the light emitting layer EL through the hole transport layer and the electron transport layer and combine to produce light to be emitted by the light emitting layer EL.

The second electrode CE may be provided on the light emitting layer EL. The second electrode CE may be shared by many or all of the pixels. The second electrode CE may be disposed on the light emitting layer EL in the emission area, and may be disposed on the pixel defining layer in an area excluding the emission area.

The pixel defining layer PDL may define an emission area or an opening area. The pixel defining layer may separate and insulate the first electrode AE of each of the plurality of light emitting elements ED.

Referring to FIG. 6, FIG. 7, and FIG. 8, the display device 10 may include the demultiplexer 400 disposed between the display driver 200 and the first-type area NML. The demultiplexer 400 may be connected to the display driver 200 through the fan-out lines FOL, and may be connected to a data line or a connection line through the first and/or second fan-out lines FOL1 and/or FOL2. The demultiplexer 400 may divide the outputs of the display driver 200 received through the fan-out lines FOL into the first and second fan-out lines FOL1 and FOL2 and may output the divided outputs. The demultiplexer 400 may time-divide one input into two outputs. The demultiplexer 400 may time-divide one input into three or more outputs using a high-frequency clock signal, and may reduce the number of display drivers 200 as the frequency of the clock signal increases.

The demultiplexer 400 may electrically connect the display driver 200 to one of the first-type area NML and the second-type area BRS during (and for) the first period t1, and may electrically connect the display driver 200 to the other of the first-type area NML and the second-type area BRS during (and for) the second period t2. Referring to FIG. 7, the demultiplexer 400 may turn on the first switching element ST1 based on (and/or in response to) a first clock signal CLA, and connect the first fan-out line FOL1 to the first connection line CL1. The demultiplexer 400 may turn on a second switching element ST2 based on (and/or in response to) a second clock signal CLB, and connect the second fan-out line FOL2 to the $(3n+1)^{th}$ to $(4n)^{th}$ data lines DL(3n+1) to DL(4n). The first clock signal CLA may turn on the first switching element ST1 during the first period t1 of an output period 1H of the display driver 200, and the second clock signal CLB may turn on the second switching element ST2 during the second period t2 immediately after the first period t1.

The demultiplexer 400 may include the first to fourth switching elements ST1 to ST4. The first switching element ST1 may be turned on in the first period t1 based on the first clock signal CLA to electrically connect the display driver 200 to the second-type area BRS. The second switching element ST2 may be turned on in the second period t2 based on the second clock signal CLB to connect the display driver 200 to a data line of the first-type area NML. The third switching element ST3 may be turned on in the first period t1 based on the first clock signal CLA to connect the display driver 200 to a data line of the first-type area NML. The fourth switching element ST4 may be turned on in the second period t2 based on the second clock signal CLB to electrically connect the display driver 200 to the second-type area BRS.

The demultiplexer 400 may connect the first display driver 210 to the first connection line CL1 during the first period t1. The demultiplexer 400 may turn on the first switching element ST1 during the first period t1, and the output of the first display driver 210 may be supplied to the first connection line CL1. Accordingly, the first display driver 210 may supply a data voltage to the third display area SDA3 during the first period t1.

The demultiplexer 400 may connect the first display driver 210 to a data line of the fourth display area SDA4 during the second period t2. The demultiplexer 400 may turn on the second switching element ST2 for the second period t2. The first display driver 210 may supply a data voltage to the fourth display area SDA4 during the second period t2.

The demultiplexer 400 may connect the second display driver 220 to a data line of the fifth display area SDA5 during the first period t1. The demultiplexer 400 may turn on the third switching element ST3 during the first period t1. Accordingly, The first display driver 210 may supply a data voltage to the fifth display area SDA5 during the first period t1.

The demultiplexer 400 may connect the second display driver 220 to the second connection line CL2 during the second period t2. The demultiplexer 400 may turn on the fourth switching element ST4 during the second period t2, and the output of the second display driver 220 may be supplied to the second connection line CL2. Accordingly, the second display driver 220 may supply the data voltage to the second display area SDA2 during the second period t2.

The demultiplexer 400 may connect the third display driver 230 to the third connection line CL3 during the first period t1. The demultiplexer 400 may turn on the first switching element ST1 during the first period t1, and the output of the third display driver 230 may be supplied to the third connection line CL3. Accordingly, the third display driver 230 may supply a data voltage to the first display area SDA1 during the first period t1.

The demultiplexer 400 may connect the third display driver 230 to a data line of the sixth display area SDA6 during the second period t2. The demultiplexer 400 may turn on the second switching element ST2 during the second period t2. Accordingly, the third display driver 230 may supply a data voltage to the sixth display area SDA6 during the second period t2.

The demultiplexer 400 may connect the fourth display driver 240 to a data line of the seventh display area SDA7 during the first period t1. The demultiplexer 400 may turn on the third switching element ST3 during the first period t1. Accordingly, the fourth display driver 240 may supply a data voltage to the seventh display area SDA7 during the first period t1.

The demultiplexer 400 may connect the fourth display driver 240 to the fourth connection line CL4 during the second period t2. The demultiplexer 400 may turn on the fourth switching element ST4 during the second period t2, and the output of the fourth display driver 240 may be supplied to the fourth connection line CL4. Accordingly, The fourth display driver 240 may supply a data voltage to the twelfth display area SDA12 during the second period t2.

The demultiplexer 400 may connect the fifth display driver 250 to the fifth connection line CL5 during the first period t1. The demultiplexer 400 may turn on the first switching element ST1 during the first period t1, and the output of the fifth display driver 250 may be supplied to the fifth connection line CL5. Accordingly, the fifth display driver 250 may supply a data voltage to the eleventh display area SDA11 during the first period t1.

The demultiplexer 400 may connect the fifth display driver 250 to a data line of the eighth display area SDA8 during the second period t2. The demultiplexer 400 may turn on the second switching element ST2 during the second period t2. Accordingly, the fifth display driver 250 may supply a data voltage to the eighth display area SDA8 during the second period t2.

The demultiplexer 400 may connect the sixth display driver 260 to a data line of the ninth display area SDA9 during the first period t1. The demultiplexer 400 may turn on the third switching element ST3 during the first period t1. Accordingly, The sixth display driver 260 may supply a data voltage to the ninth display area SDA9 during the first period t1.

The demultiplexer 400 may connect the sixth display driver 260 to the sixth connection line CL6 during the second period t2. The demultiplexer 400 may turn on the fourth switching element ST4 during the second period t2, and the output of the sixth display driver 260 may be supplied to the sixth connection line CL6. Accordingly, the sixth display driver 260 may supply a data voltage to the tenth display area SDA10 during the second period t2.

The display device 10 may drive the twelve display areas SDA1 to SDA12 using the six display drivers 210 to 260 by including the first to sixth connection lines CL1 to L6. The second connection line CL2 may bypass the first connection line CL1, and the third connection line CL3 may bypass the first connection line CL1, so that the complexity of the lines of the display panel 100 may be reduced. The fifth connection line CL5 may bypass the sixth connection line CL6, and the fourth connection line CL4 may bypass the fifth connection line CL5, so that the complexity of the lines of the display panel 100 may be reduced. The display device 10 may drive the odd display areas and the even display areas by performing time division driving. As illustrated by the display device 10, embodiments may improve design freedom and reduce costs by including the second-type area BRS free from structural constraints of the display driver 200.

Figure 10:
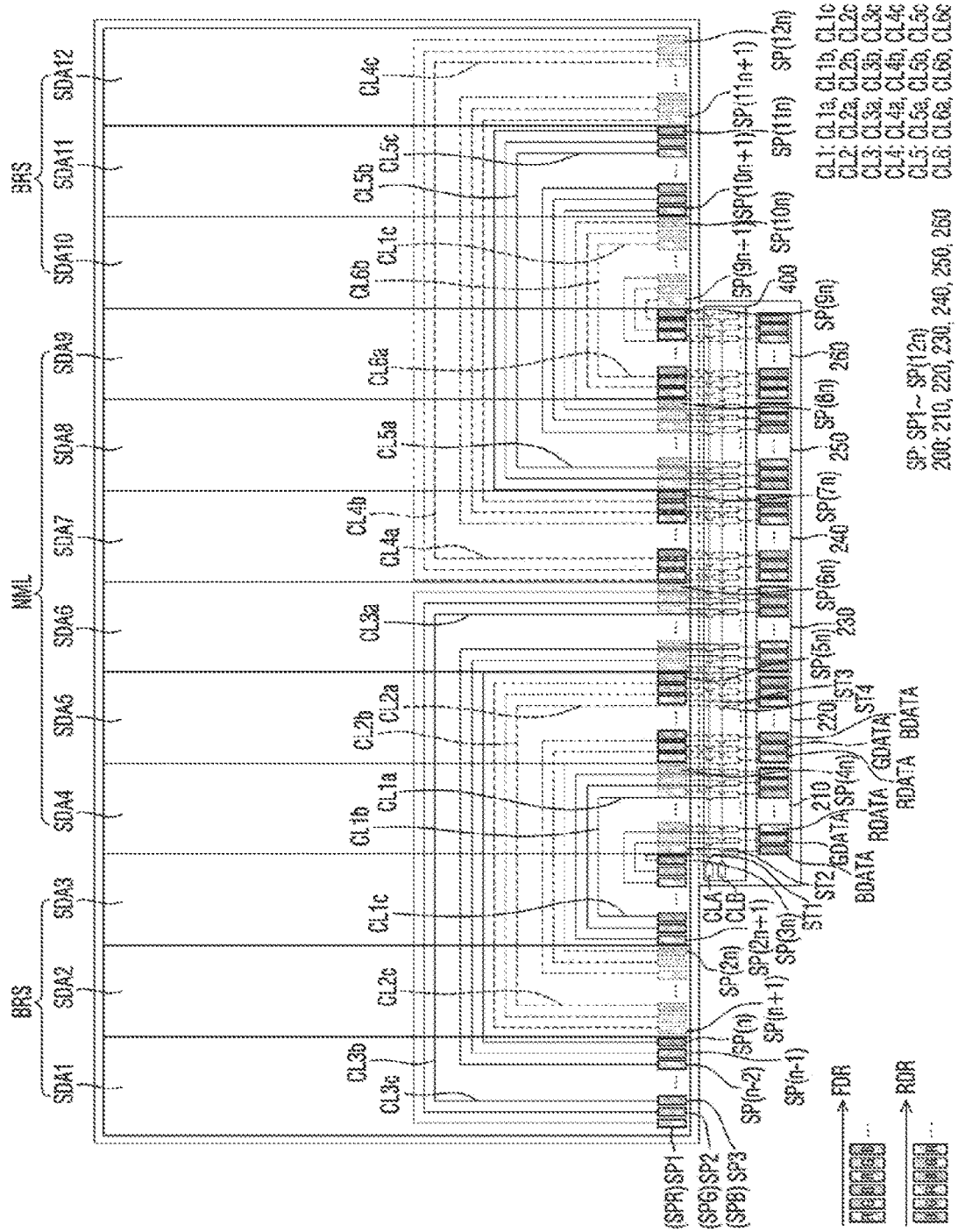
FIG. 10 is a diagram illustrating an operation of a display device during a first period according to one embodiment.

FIG. 10 is a diagram illustrating an operation of a display device during a first period according to one embodiment.

Referring to FIG. 10, an odd display area among the first to twelfth display areas SDA1 to SDA12 may receive a data voltage from the display driver 200 during the first period t1 and may display an image.

The first, third, and fifth display drivers 210, 230, and 250 may have an output mapping in a reverse direction RDR during the first period t1. The first, third, and fifth display drivers 210, 230, and 250 may output the data voltages mapped in the order of blue data BDATA, green data GDATA, and red data RDATA to fan-out lines FOL. The order of the data voltages outputted from the first display driver 210 may be inverted by the first connection line CL1, and may be supplied to pixels SP arranged in the order of the red pixel SPR, the green pixel SPG, and the blue pixel SPB in the third display area SDA3. The order of the data voltages outputted from the third display driver 230 may be inverted by the third connection line CL3, and may be supplied to pixels SP arranged in the order of the red pixel SPR, the green pixel SPG, and the blue pixel SPB in the first display area SDA1. The order of the data voltages outputted from the fifth display driver 250 may be inverted by the fifth connection line CL5, and may be supplied to pixels SP arranged in the order of the red pixel SPR, the green pixel SPG, and the blue pixel SPB in the eleventh display area SDA11.

The second, fourth, and sixth display drivers 220, 240, and 260 may have an output mapping in a forward direction FDR during the second period t2. The second, fourth, and sixth display drivers 220, 240, and 260 may output the data voltages mapped in the order of the red data RDATA, the green data GDATA, and the blue data BDATA to fan-out lines FOL. The data voltages outputted from the second display driver 220 may maintain the order of the forward direction FDR, and may be supplied to pixels SP arranged in the order of the red pixel SPR, the green pixel SPG, and the blue pixel SPB in the fifth display area SDA5. The data voltages outputted from the fourth display driver 240 may maintain the order of the forward direction FUR, and may be supplied to pixels SP arranged in the order of the red pixel SPR, the green pixel SPG, and the blue pixel SPB in the seventh display area SDA7. The data voltages outputted from the sixth display driver 260 may maintain the order of the forward direction FDR, and may be supplied to pixels SP arranged in the order of the red pixel SPR, the green pixel SPG, and the blue pixel SPB in the ninth display area SDA9.

The display drivers 200 adjacent to each other among the first to sixth display drivers 210 to 260 may have output mappings in different directions. When one display driver 200 has an output mapping in the forward direction FDR, an immediately adjacent display driver 200 may have an output mapping in the reverse direction RDR. The data voltage of the display driver 200 having the output mapping in the forward direction FDR may be directly supplied to the first-type area NML, and the data voltage of the display driver 200 having the output mapping in the reverse direction RDR may be inverted through the connection line and supplied to the second-type area BRS. When one display driver 200 has an output mapping in the reverse direction RDR, an immediately adjacent display driver 200 may have an output mapping in the forward direction FDR. The first to sixth display drivers 210 to 260 may control the direction of an output mapping through hardware setting and/or software setting. The display device 10 may display an image in the odd display areas during the first period t1 by setting the output mapping of the first, third, and fifth display drivers 210, 230, and 250 in the reverse direction RDR and setting the output mapping of the second, fourth, and sixth display drivers 220, 240, and 260 in the forward direction FDR. The display device 10 may include standardized display drivers 200 for controlling the display panel 100. According to the design of the display panel 100, the output mapping directions of the display drivers 200 may be suitably configured.

Figure 11:
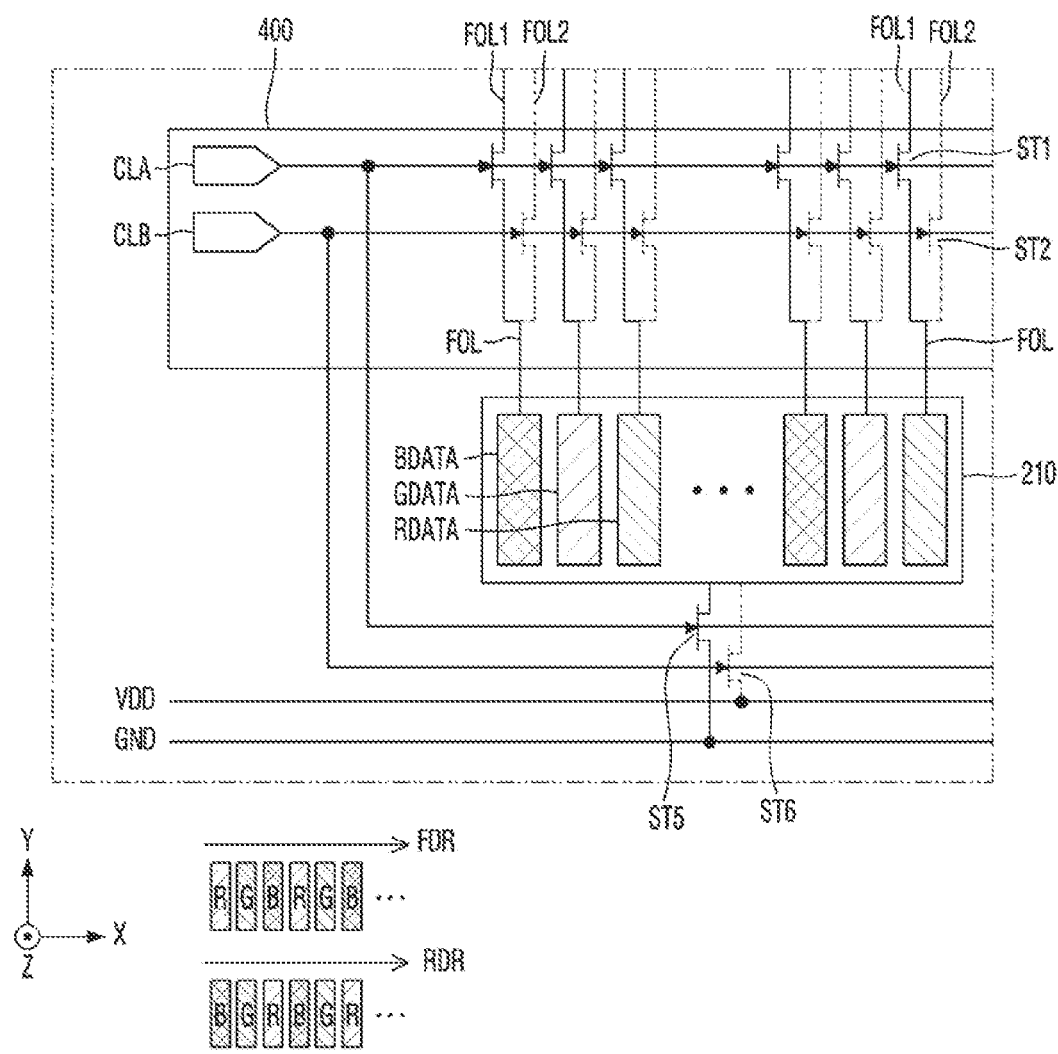
FIG. 11 is a view illustrating a mapping process of a first display driver in a display device during a first period according to one embodiment.

FIG. 11 is a view illustrating a mapping process of a first display driver during a first period according to one embodiment.

Referring to FIG. 11, the display driver 200 may control the direction of an output mapping through hardware settings. The first display driver 210 may receive a ground voltage GND through the turned-on fifth switching element ST5 during the first period t1. The fifth switching element ST5 may be turned on based on the first clock signal CLA applied during the first period t1. The ground voltage GND may apply a bias in a reverse direction to the first display driver 210. The first display driver 210 may have the output mapping in the reverse direction RDR during the first period t1.

The output mapping method of the display driver 200 is not limited to that illustrated in FIG. 11, and the first display driver 210 may have the output mapping in the reverse direction RDR during the first period t1 through software mapping.

Figure 12:
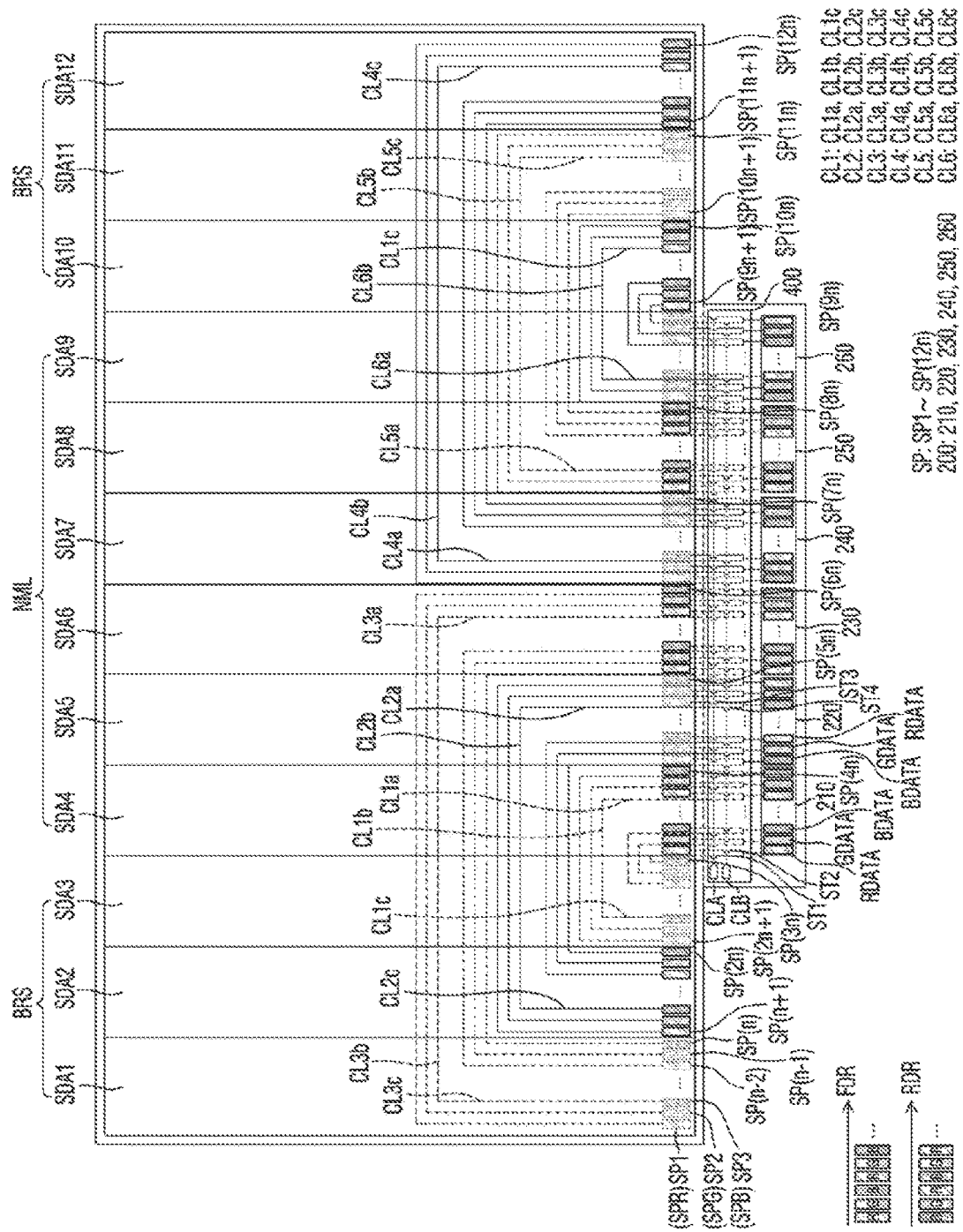
FIG. 12 is a diagram illustrating an operation of a display device during a second period according to one embodiment.

FIG. 12 is a diagram illustrating an operation of a display device during a second period according to one embodiment.

Referring to FIG. 12, an even display area among the first to twelfth display areas SDA1 to SDA12 may receive a data voltage from the display driver 200 during the second period t2 and may display an image.

The first, third, and fifth display drivers 210, 230, and 250 may have the output mapping in the forward direction FDR during the second period t2. The first, third, and fifth display drivers 210, 230, and 250 may output data voltages mapped in the order of the red data RDATA, the green data GDATA, and the blue data BDATA to fan-out lines FOL. The data voltages outputted from the first display driver 210 may maintain the order of the forward direction FDR, and may be supplied to pixels SP arranged in the order of the red pixel SPR, the green pixel SPG, and the blue pixel SPB in the fourth display area SDA4. The data voltages outputted from the third display driver 230 may maintain the order of the forward direction FDR, and may be supplied to pixels SP arranged in the order of the red pixel SPR, the green pixel SPG, and the blue pixel SPB in the sixth display area SDA6. The data voltages outputted from the fifth display driver 250 may maintain the order of the forward direction FDR, and may be supplied to pixels SP arranged in the order of the red pixel SPR, the green pixel SPG, and the blue pixel SPB in the eighth display area SDA8.

The second, fourth, and sixth display drivers 220, 240, and 260 may have an output mapping in the reverse direction RDR during the second period t2. The second, fourth, and sixth display drivers 220, 240, and 260 may output data voltages mapped in the order of the blue data BDATA, the green data GDATA, and the red data RDATA to fan-out lines FOL. The order of the data voltages outputted from the second display driver 220 may be inverted by the second connection line CL2, and may be supplied to pixels SP arranged in the order of the red pixel SPR, the green pixel SPG, and the blue pixel SPB in the second display area SDA2. The order of the data voltages outputted from the fourth display driver 240 may be inverted by the fourth connection line CL4, and may be supplied to pixels SP arranged in the order of the red pixel SPR, the green pixel SPG, and the blue pixel SPB in the twelfth display area SDA12. The order of the data voltages outputted from the sixth display driver 260 may be inverted by the sixth connection line CL6, and may be supplied to pixels SP arranged in the order of the red pixel SPR, the green pixel SPG, and the blue pixel SPB in the tenth display area SDA10.

The display drivers 200 adjacent to each other among the first to sixth display drivers 210 to 260 may have output mappings in different directions. The first to sixth display drivers 210 to 260 may control the direction of an output mapping through hardware setting or software setting. The display device 10 may display an image in the even display area during the second period t2 by setting the output mapping of the first, third, and fifth display drivers 210, 230, and 250 in the forward direction FDR and setting the output mapping of the second, fourth, and sixth display drivers 220, 240, and 260 in the reverse direction RDR. The display device 10 may include standardized display drivers 200 for controlling the display panel 100. According to the design of the display panel, the output mapping directions of the display drivers 200 may be suitably configured.

Figure 13:
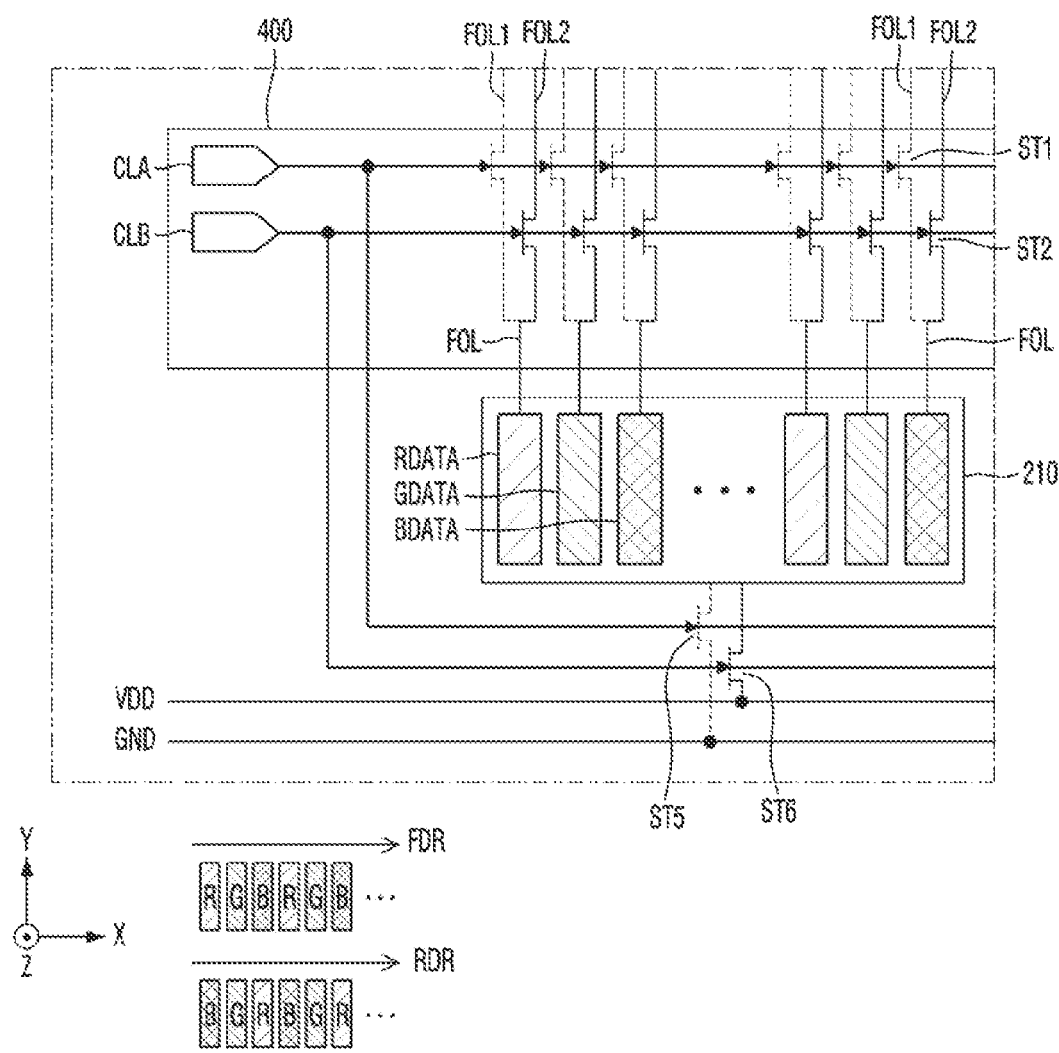
FIG. 13 is a view illustrating a mapping process of a first display driver in a display device during a second period according to one embodiment.

FIG. 13 is a view illustrating a mapping process of a first display driver during a second period in a display device according to one embodiment.

Referring to FIG. 13, the display driver 200 may control the direction of an output mapping through hardware settings. The first display driver 210 may receive a high potential voltage VDD through the turned-on sixth switching element ST6 during the second period t2. The sixth switching element ST6 may be turned on based on the second clock signal CLB applied during the second period t2. The high potential voltage VDD may apply a bias in a forward direction to the first display driver 210. The first display driver 210 may have an output mapping in the forward direction FDR during the second period t2.

The output mapping method of the display driver 200 is not limited to that illustrated in FIG. 13, and the first display driver 210 may have the output mapping in the forward direction FDR during the second period t2 through software mapping.

Figure 14:
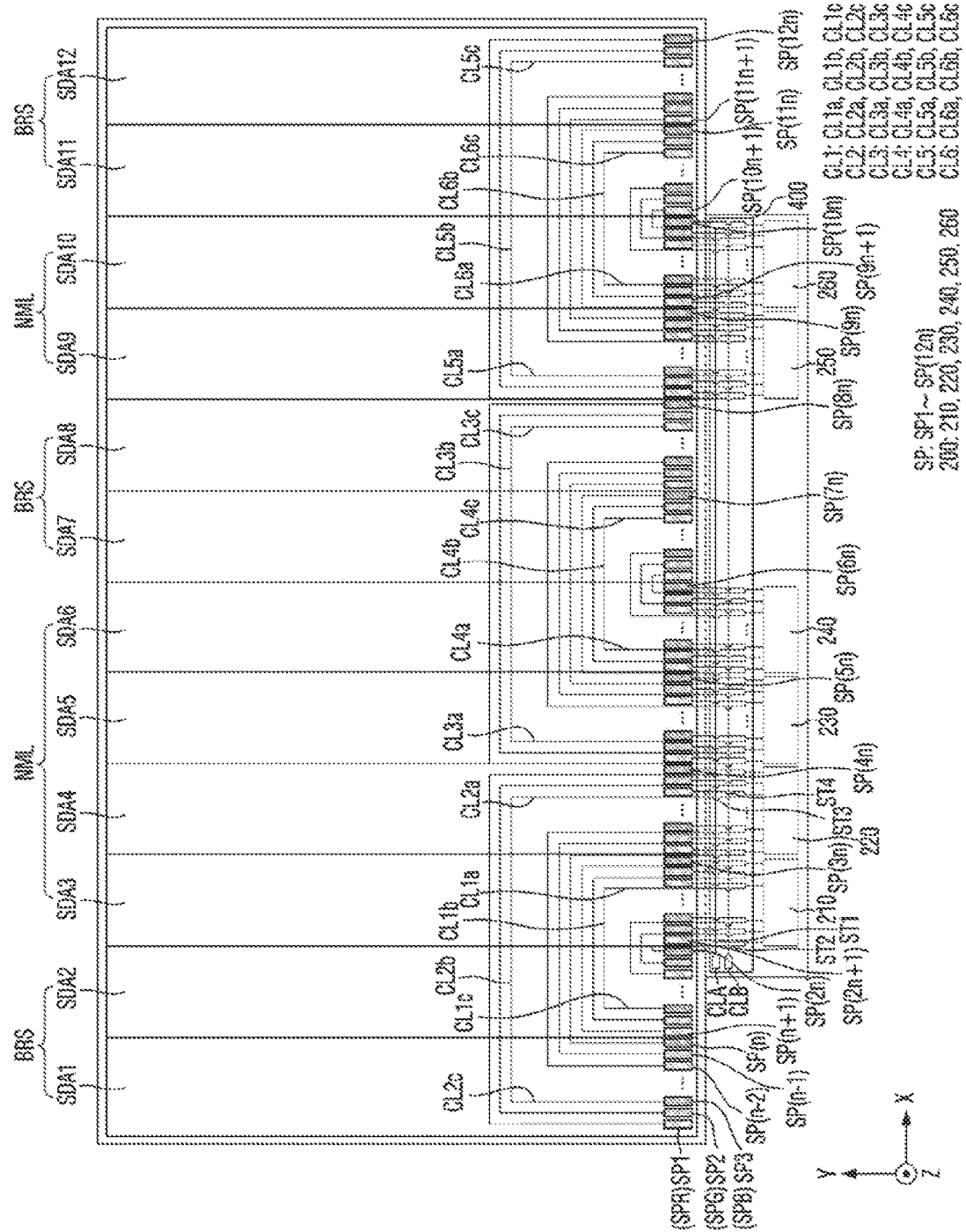
FIG. 14 is a view illustrating a relationship between a plurality of display areas and a plurality of display drivers in a display device according to one embodiment.

FIG. 14 is a view illustrating a relationship between display areas and display drivers in a display device according to one embodiment.

Referring to FIG. 14, the display area DA may include first to twelfth display areas SDA1 to SDA12. The third to sixth, ninth, and tenth display areas SDA3, SDA4, SDA5, SDA6, SDA9, and SDA10 may correspond to (and/or constitute) the first-type area NML. The display areas SDA3, SDA4, SDA5, SDA6, SDA9, and SDA10 may correspond to the first to sixth display drivers 210, 220, 230, 240, 250 and 260, respectively.

The first, second, seventh, eighth, eleventh, and twelfth display areas SDA1, SDA2, SDA7, SDA5, SDA11, and SDA12 may correspond to (and/or constitute) the second-type area BRS. The second-type area BRS may not be directly connected to the display driver 200, and may be electrically connected to the display driver 200 through a connection line passing through the first-type area NML.

Each of the first to twelfth display areas SDA1 to SDA12 may include pixels SP arranged in n pixel columns (n is a positive integer). The n may be 1920, but n may be increased or decreased according to the resolution of the display device. The first display area SDA1 may include first to $n^{th}$ pixels SP1 to SP(n), and the twelfth display area SDA12 may include $(11n+1)^{th}$ to $(12n)^{th}$ pixels SP(11n+1) to SP(12n).

The display area DA may include first to sixth connection lines CL1 to CL6.

The first connection line CL1 may electrically connect the first display driver 210 to the second display area SDA2. The first connection line CL1 may be disposed in the second and third display areas SDA2 and SDA3 to extend to the second-type area BRS via the first-type area NML. The first connection line CL1 may include first to third portions CL1a, CL1b, and CL1c. The first portion CL1a of the first connection line CL1 may be connected to the second switching element ST2 of the demultiplexer 400, and may extend in the second direction (Y-axis direction) in the third display area SDA3. The second portion CL1b of the first connection line CL1 may be bent from the first portion CL1a and extend in a direction opposite to the first direction (X-axis direction). The second portion CL1b of the first connection line CL1 may extend from the third display area SDA3 to the second display area SDA2. The third portion CL1c of the first connection line CL1 may be bent from the second portion CL1b and extend in a direction opposite to the second direction (Y-axis direction). The third portion CL1c of the first connection line CL1 may be connected to one or more data lines provided in the second display area SDA2 through at least one contact pad disposed on the lower side of the second display area SDA2.

The second connection line CL2 may electrically connect the second display driver 220 to the first display area SDA1. The second connection line CL2 may be disposed in the first to fourth display areas SDA1, SDA2, SDA3, and SDA4 to extend to the second-type area BRS via the first-type area NML. The second connection line CL2 may reduce the complexity of the lines of the display panel 100 by bypassing the first connection line CL1. The second connection line CL2 may include first to third portions CL2a, CL2b, and CL2c. The first portion CL2a of the second connection line CL2 may be connected to the third switching element ST3 of the demultiplexer 400, and may extend in the second direction (Y-axis direction) in the fourth display area SDA4. The second portion CL2b of the second connection line CL2 may be bent from the first portion CL2a and extend in a direction opposite to the first direction (X-axis direction). The second portion CL2b of the second connection line CL2 may extend from the fourth display area SDA4 to the first display area SDA1. The third portion CL2c of the second connection line CL2 may be bent from the second portion CL2b and extend in a direction opposite to the second direction (Y-axis direction). The third portion CL2c of the second connection line CL2 may be connected to one or more data lines provided in the first display area SDA1 through at least one contact pad disposed on the lower side of the first display area SDA1.

The third connection line CL3 may electrically connect the third display driver 230 to the eighth display area SDA8. The third connection line CL3 may be disposed in the fifth to eighth display areas SDA5, SDA6, SDA7, and SDA8 to extend to the second-type area BRS via the first-type area NML. The third connection line CL3 may reduce the complexity of the lines of the display panel 100 by bypassing the fourth connection line CL4. The third connection line CL3 may include the first to third portions CL3a, CL3b, and CL3c. The first portion CL3a of the third connection line CL3 may be connected to the second switching element ST2 of the demultiplexer 400, and may extend in the second direction (Y-axis direction) in the fifth display area SDA5. The second portion CL3b of the third connection line CL3 may be bent from the first portion CL3a and extend in the first direction (X-axis direction). The second portion CL3b of the third connection line CL3 may extend from the fifth display area SDA5 to the eighth display area SDA8. The third portion CL3c of the third connection line CL3 may be bent from the second portion CL3b and extend in a direction opposite to the second direction (Y-axis direction). The third portion CL3c of the third connection line CL3 may be connected to one or more data lines provided in the eighth display area SDA8 through at least one contact pad disposed on the lower side of the eighth display area SDA8.

The fourth connection line CL4 may electrically connect the fourth display driver 240 to the seventh display area SDA7. The fourth connection line CL4 may be disposed in the sixth and seventh display areas SDA6 and SDA7 to extend to the second-type area BRS via the first-type area NML. The fourth connection line CL4 may include first to third portions CL4a, CL4b, and CL4c. The first portion CL4a of the fourth connection line CL4 may be connected to the third switching element ST3 of the demultiplexer 400, and may extend in the second direction (Y-axis direction) in the sixth display area SDA6. The second portion CL4b of the fourth connection line CL4 may be bent from the first portion CL4a and extend in the first direction (X-axis direction). The second portion CL4b of the fourth connection line CL4 may extend from the sixth display area SDA6 to the seventh display area SDA7. The third portion CL4c of the fourth connection line CL4 may be bent from the second portion CL4b and extend in a direction opposite to the second direction (Y-axis direction). The third portion CL4c of the fourth connection line CL4 may be connected to one or more data lines provided in the seventh display area SDA7 through at least one contact pad disposed on the lower side of the seventh display area SDA7.

The fifth connection line CL5 may electrically connect the fifth display driver 250 to the twelfth display area SDA12. The fifth connection line CL5 may be disposed in the ninth to twelfth display areas SDA9, SDA10, SDA11, and SDA12 to extend to the second-type area BRS via the first-type area NML. The fifth connection line CL5 may reduce the complexity of the lines of the display panel 100 by bypassing the sixth connection line CL6. The fifth connection line CL5 may include first to third portions CL5a, CL5b, and CL5c. The first portion CL5a of the fifth connection line CL5 may be connected to the second switching element ST2 of the demultiplexer 400, and may extend in the second direction (Y-axis direction) in the ninth display area SDA9. The second portion CL5b of the fifth connection line CL5 may be bent from the first portion CL5a and extend in the first direction (X-axis direction). The second portion CL5b of the fifth connection line CL5 may extend from the ninth display area SDA9 to the twelfth display area SDA12. The third portion CL5c of the fifth connection line CL5 may be bent from the second portion CL5b and extend in a direction opposite to the second direction (Y-axis direction). The third portion CL5c of the fifth connection line CL5 may be connected to one or more data lines provided in the twelfth display area SDA12 through at least one contact pad disposed on the lower side of the twelfth display area SDA12.

The sixth connection line CL6 may electrically connect the sixth display driver 260 to the eleventh display area SDA11. The sixth connection line CL6 may be disposed in the tenth and eleventh display areas SDA10 and SDA11 to extend to the second-type area BRS via the first-type area NML. The sixth connection line CL6 may include first to third portions CL6a, CL6b, and CL6c. The first portion CL6a of the sixth connection line CL6 may be connected to the third switching element ST3 of the demultiplexer 400, and may extend in the second direction (Y-axis direction) in the tenth display area SDA10. The second portion CL6b of the sixth connection line CL6 may be bent from the first portion CL6a and extend in the first direction (X-axis direction). The second portion CL6b of the sixth connection line CL6 may extend from the tenth display area SDA10 to the eleventh display area SDA11. The third portion CL6c of the sixth connection line CL6 may be bent from the second portion CL6b and extend in a direction opposite to the second direction (Y-axis direction). The third portion CL6c of the sixth connection line CL6 may be connected to one or more data lines provided in the eleventh display area SDA11 through at least one contact pad disposed on the lower side of the eleventh display area SDA11.

The display area DA includes the first to sixth connection lines CL1, CL2, CL3, CL4, CL5 and CL6 extending to the second-type area BRS via the first-type area NML, the periphery of the second-type area BRS may be simplified. Advantageously, design freedom may be improved, and costs may be reduced.

The display device 10 may include a demultiplexer 400 disposed between the display driver 200 and the first-type area NML. The demultiplexer 400 may be connected to the display driver 200 through fan-out lines FOL, and may be connected to a data line or a connection line through the first and second fan-out lines FOL1 and FOL2. The demultiplexer 400 may divide the outputs of the display driver 200 received through the fan-out line FOL into the first and second fan-out lines FOL1 and FOL2 and may output the divided outputs. The demultiplexer 400 may time-divide one input into two outputs. The demultiplexer 400 may time-divide one input into three or more outputs using a high-frequency clock signal, and may reduce the number of display drivers 200 as the frequency of the clock signal increases.

The demultiplexer 400 may electrically connect the display driver 200 to one of the first-type area NML and the second-type area BRS during the first period t1, and may electrically connect the display driver 200 to the other of the first-type area NML and the second-type area BRS during the second period t2.

The demultiplexer 400 may include the first to fourth switching elements ST1 to ST4. The first switching element ST1 may be turned on in the first period t1 based on the first clock signal CLA to connect the display driver 200 to a data line of the first-type area NML. The second switching element ST2 may be turned on in the second period t2 based on the second clock signal CLB to electrically connect the display driver 200 to the second-type area BRS. The third switching element ST3 may be turned on in the first period t1 based on the first clock signal CLA to electrically connect the display driver 200 to the second-type area BRS. The fourth switching element ST4 may be turned on in the second period t2 based on the second clock signal CLB to connect the display driver 200 to a data line of the first-type area NML.

The demultiplexer 400 may connect the first display driver 210 to a data line of the third display area SDA3 during the first period t1. The demultiplexer 400 may turn on the first switching element ST1 during the first period t1. Accordingly, the first display driver 210 may supply a data voltage to the third display area SDA3 during the first period t1.

The demultiplexer 400 may connect the first display driver 210 to the first connection line CL1 during the second period t2. The demultiplexer 400 may turn on the second switching element ST2 during the second period t2, and the output of the first display driver 210 may be supplied to the first connection line CL1. Accordingly, the first display driver 210 may supply a data voltage to the second display area SDA2 during the second period t2.

The demultiplexer 400 may connect the second display driver 220 to the second connection line CL2 during the first period t1. The demultiplexer 400 may turn on the third switching element ST3 during the first period t1, and the output of the second display driver 220 may be supplied to the second connection line CL2. Accordingly, the second display driver 220 may supply a data voltage to the first display area SDA1 during the first period t1.

The demultiplexer 400 may connect the second display driver 220 to a data line of the fourth display area SDA4 during the second period t2. The demultiplexer 400 may turn on the fourth switching element ST4 during the second period t2. Accordingly, the second display driver 220 may supply a data voltage to the fourth display area SDA4 during the second period t2.

The demultiplexer 400 may connect the third display driver 230 to a data line of the fifth display area SDA5 during the first period t1. The demultiplexer 400 may turn on the first switching element ST1 during the first period t1. Accordingly, the third display driver 230 may supply a data voltage to the fifth display area SDA5 during the first period t1.

The demultiplexer 400 may connect the third display driver 230 to the third connection line CL3 during the second period t2. The demultiplexer 400 may turn on the second switching element ST2 during the second period t2, and the output of the third display driver 230 may be supplied to the third connection line CL3. Accordingly, the third display driver 230 may supply a data voltage to the eighth display area SDA8 during the second period t2.

The demultiplexer 400 may connect the fourth display driver 240 to the fourth connection line CL4 during the first period t1. The demultiplexer 400 may turn on the third switching element ST3 during the first period t1, and the output of the fourth display driver 240 may be supplied to the fourth connection line CL4. Accordingly, the fourth display driver 240 may supply a data voltage to the seventh display area SDA7 during the first period t1.

The demultiplexer 400 may connect the fourth display driver 240 to a data line of the sixth display area SDA6 during the second period t2. The demultiplexer 400 may turn on the fourth switching element ST4 during the second period t2. Accordingly, the fourth display driver 240 may supply a data voltage to the sixth display area SDA6 during the second period t2.

The demultiplexer 400 may connect the fifth display driver 250 to a data line of the ninth display area SDA9 during the first period t1. The demultiplexer 400 may turn on the first switching element ST1 during the first period t1. Accordingly, the fifth display driver 250 may supply a data voltage to the ninth display area SDA9 during the first period t1.

The demultiplexer 400 may connect the fifth display driver 250 to the fifth connection line CL5 during the second period t2. The demultiplexer 400 may turn on the second switching element ST2 during the second period t2, and the output of the fifth display driver 250 may be supplied to the fifth connection line CL5. Accordingly, the fifth display driver 250 may supply a data voltage to the twelfth display area SDA12 during the second period t2.

The demultiplexer 400 may connect the sixth display driver 260 to the sixth connection line CL6 during the first period t1. The demultiplexer 400 may turn on the third switching element ST3 during the first period t1, and the output of the sixth display driver 260 may be supplied to the sixth connection line CL6. Accordingly, the sixth display driver 260 may supply a data voltage to the eleventh display area SDA11 during the first period t1.

The demultiplexer 400 may connect the sixth display driver 260 to a data line of the tenth display area SDA10 during the second period t2. The demultiplexer 400 may turn on the fourth switching element ST4 during the second period t2. Accordingly, the sixth display driver 260 may supply a data voltage to the tenth display area SDA10 during the second period t2.

The display device 10 may drive the twelve display areas SDA1 to SDA12 using the six display drivers 210 to 260 by including the first to sixth connection lines CL1 to L6. The second connection line CL2 may bypass the first connection line CL1, the third connection line CL3 may bypass the fourth connection line CL4, and the fifth connection line CL5 may bypass the sixth connection line CL6, so that the complexity of the lines of the display panel 100 may be reduced. The display device 10 may drive the odd display area and the even display area by performing time division driving. As illustrated by display device 10, embodiments may improve design freedom and reduce costs by including the second-type area BRS free from structural constraints of the display driver 200.

Figure 15:
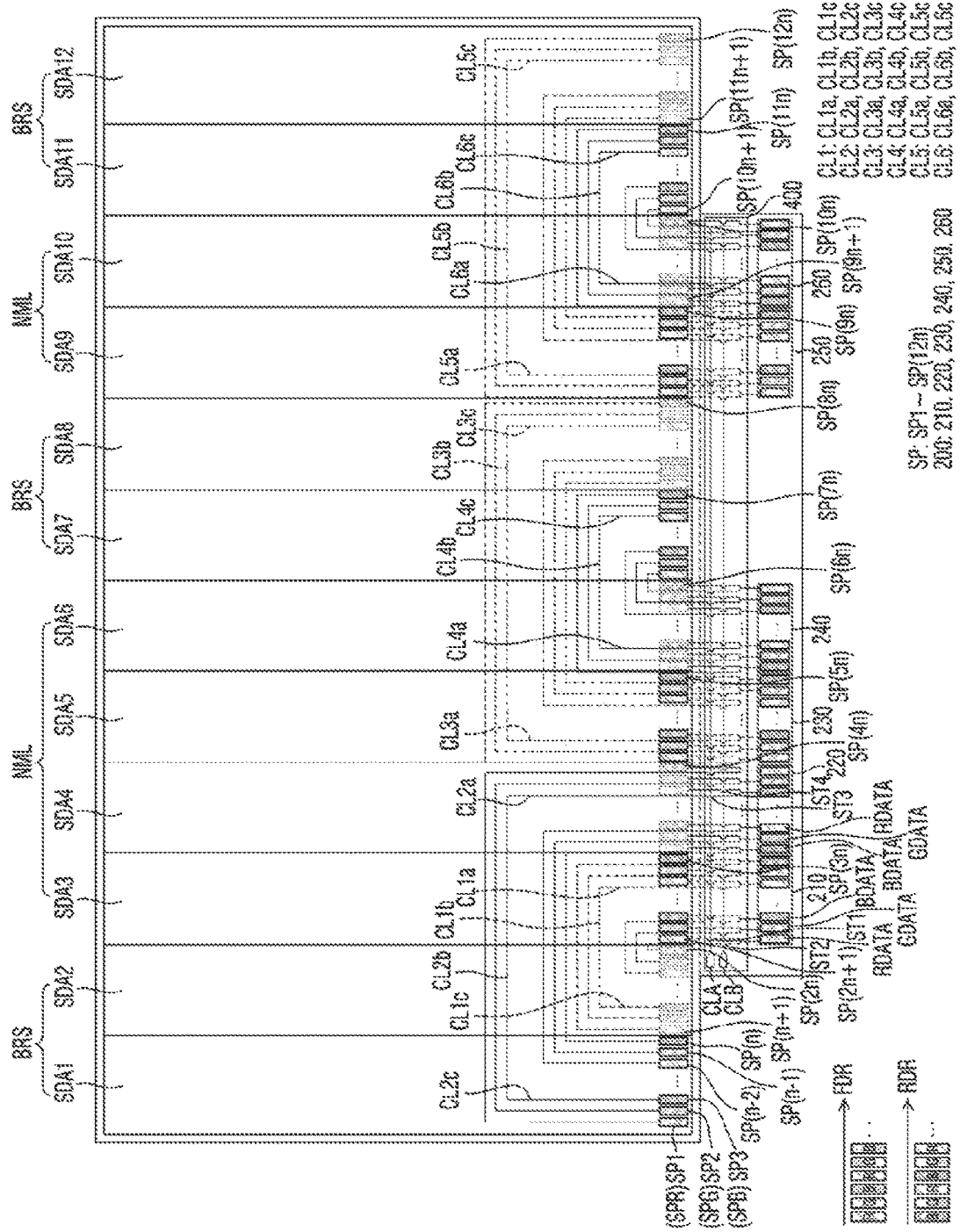
FIG. 15 is a diagram illustrating an operation of a display device during a first period according to one embodiment.

FIG. 15 is a diagram illustrating an operation of a display device during a first period according to one embodiment.

Referring to FIG. 15, an odd display area among the first to twelfth display areas SDA1 to SDA12 may receive a data voltage from the display driver 200 during the first period t1 and may display an image.

The first, third, and fifth display drivers 210, 230, and 250 may have an output mapping in the forward direction FDR during the first period t1. The first, third, and fifth display drivers 210, 230, and 250 may output data voltages mapped in the order of the red data RDATA, the green data GDATA, and the blue data BDATA to fan-out lines FOL. The data voltages outputted from the first display driver 210 may maintain the order of the forward direction FDR, and may be supplied to pixels SP arranged in the order of the red pixel SPR, the green pixel SPG, and the blue pixel SPB in the third display area SDA3. The data voltages outputted from the third display driver 230 may maintain the order of the forward direction FDR, and may be supplied to pixels SP arranged in the order of the red pixel SPR, the green pixel SPG, and the blue pixel SPB in the fifth display area SDA5. The data voltages outputted from the fifth display driver 250 may maintain the order of the forward direction FDR, and may be supplied to pixels SP arranged in the order of the red pixel SPR, the green pixel SPG, and the blue pixel SPB in the ninth display area SDA9.

The second, fourth, and sixth display drivers 220, 240, and 260 may have an output mapping in the reverse direction RDR during the first period t1. The second, fourth, and sixth display drivers 220, 240, and 260 may output data voltages mapped in the order of the blue data BDATA, the green data GDATA, and the red data RDATA to fan-out lines FOL. The order of the data voltages outputted from the second display driver 220 may be inverted by the second connection line CL2, and may be supplied to pixels SP arranged in the order of the red pixel SPR, the green pixel SPG, and the blue pixel SPB in the first display area SDA1. The order of the data voltages outputted from the fourth display driver 240 may be inverted by the fourth connection line CL4, and may be supplied to pixels SP arranged in the order of the red pixel SPR, the green pixel SPG, and the blue pixel SPB in the seventh display area SDA7. The order of the data voltages outputted from the sixth display driver 260 may be inverted by the sixth connection line CL6, and may be supplied to pixels SP arranged in the order of the red pixel SPR, the green pixel SPG, and the blue pixel SPB in the eleventh display area SDA11.

The display drivers 200 adjacent to each other among the first to sixth display drivers 210 to 260 may have output mappings in different directions. When one display driver 200 has an output mapping in the forward direction FDR, an immediately adjacent display driver 200 may have an output mapping in the reverse direction RDR. The data voltage of the display driver 200 having the output mapping in the forward direction FDR may be directly supplied to the first-type area NML, and the data voltage of the display driver 200 having the output mapping in the reverse direction RDR may be inverted through the connection line and supplied to the second-type area BRS. When one display driver 200 has an output mapping in the reverse direction RDR, an immediately adjacent display driver 200 may have an output mapping in the forward direction FDR. The first to sixth display drivers 210 to 260 may control the direction of an output mapping through hardware setting or software setting. The display device 10 may display an image in the odd display areas during the first period t1 by setting the output mapping of the first, third, and fifth display drivers 210, 230, and 250 in the forward direction FDR and setting the output mapping of the second, fourth, and sixth display drivers 220, 240, and 260 in the reverse direction RDR. The display device 10 may include standardized display drivers 200 for controlling the display panel 100. According to the design of the display panel, the output mapping directions of the display drivers 200 may be suitably configured.

Figure 16:
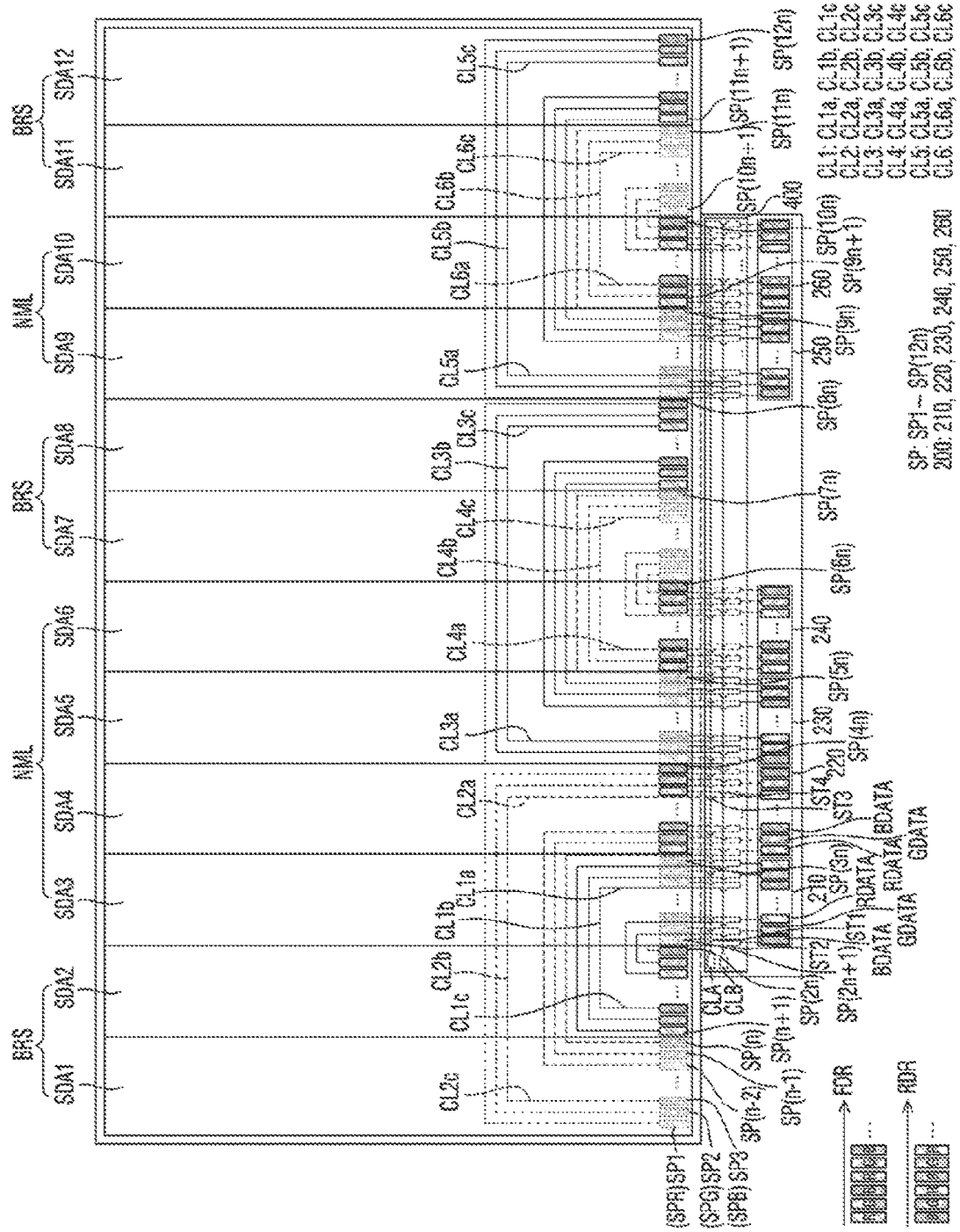
FIG. 16 is a diagram illustrating an operation of a display device during a second period according to one embodiment.

FIG. 16 is a diagram illustrating an operation of a display device during a second period according to one embodiment.

Referring to FIG. 16, an even display area among the first to twelfth display areas SDA1 to SDA12 may receive a data voltage from the display driver 200 during the second period t2 and may display an image.

The first, third, and fifth display drivers 210, 230, and 250 may have an output mapping in a reverse direction RDR during the second period t2. The first, third, and fifth display drivers 210, 230, and 250 may output data voltages mapped in the order of blue data BDATA, green data GDATA, and red data RDATA to fan-out lines FOL. The order of the data voltages outputted from the first display driver 210 may be inverted by the first connection line CL1, and may be supplied to pixels SP arranged in the order of the red pixel SPR, the green pixel SPG, and the blue pixel SPB in the second display area SDA2. The order of the data voltages outputted from the third display driver 230 may be inverted by the third connection line CL3, and may be supplied to pixels SP arranged in the order of the red pixel SPR, the green pixel SPG, and the blue pixel SPB in the eighth display area SDA8. The order of the data voltages outputted from the fifth display driver 250 may be inverted by the fifth connection line CL5, and may be supplied to pixels SP arranged in the order of the red pixel SPR, the green pixel SPG, and the blue pixel SPB in the twelfth display area SDA12.

The second, fourth, and sixth display drivers 220, 240, and 260 may have an output mapping in a forward direction FDR during the second period t2. The second, fourth, and sixth display drivers 220, 240, and 260 may output data voltages mapped in the order of the red data RDATA, the green data GDATA, and the blue data BDATA to fan-out lines FOL. The data voltages outputted from the second display driver 220 may maintain the order of the forward direction FDR, and may be supplied to pixels SP arranged in the order of the red pixel SPR, the green pixel SPG, and the blue pixel SPB in the fourth display area SDA4. The data voltages outputted from the fourth display driver 240 may maintain the order of the forward direction FUR, and may be supplied to pixels SP arranged in the order of the red pixel SPR, the green pixel SPG, and the blue pixel SPB in the sixth display area SDA6. The data voltages outputted from the sixth display driver 260 may maintain the order of the forward direction FUR, and may be supplied to pixels SP arranged in the order of the red pixel SPR, the green pixel SPG, and the blue pixel SPB in the tenth display area SDA10.

The display drivers 200 adjacent to each other among the first to sixth display drivers 210 to 260 may have output mappings in different directions. The first to sixth display drivers 210 to 260 may control the direction of an output mapping through hardware setting or software setting. The display device 10 may display an image in the even display area during the second period t2 by setting the output mapping of the first, third, and fifth display drivers 210, 230, and 250 in the reverse direction RDR and setting the output mapping of the second, fourth, and sixth display drivers 220, 240, and 260 in the forward direction FDR. The display device 10 may include standardized display drivers 200 for controlling the display panel 100. According to the design of the display panel 100, the output mapping directions of the display drivers 200 may be suitably configured.

Figure 17:
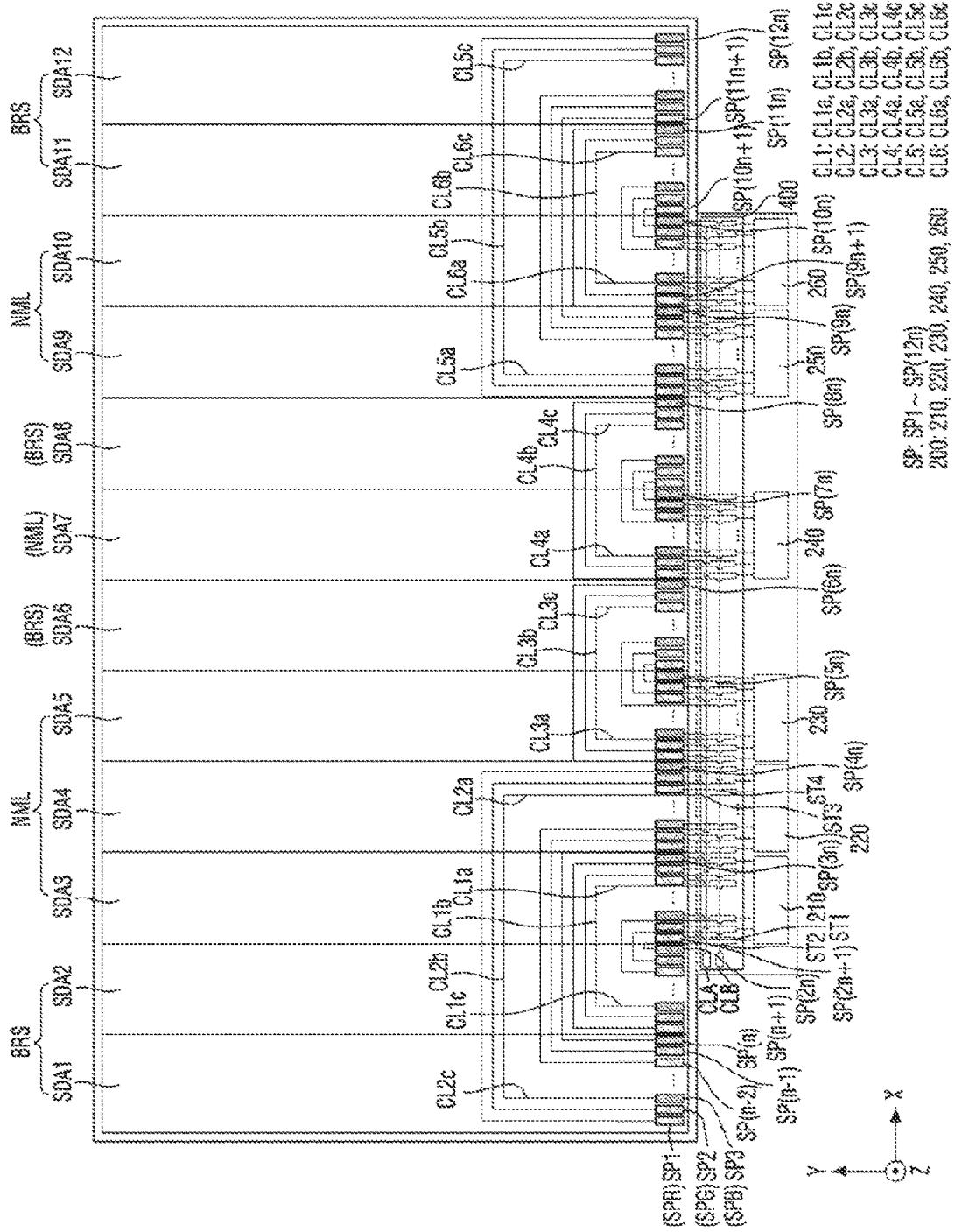
FIG. 17 is a view illustrating a relationship between a plurality of display areas and a plurality of display drivers in a display device according to one embodiment.

FIG. 17 is a view illustrating a relationship between display areas and display drivers in a display device according to one embodiment.

Referring to FIG. 17, the display area DA may include first to twelfth display areas SDA1 to SDA12. The third to fifth, seventh, ninth, and tenth display areas SDA3, SDA4, SDA5, SDA7, SDA9, and SDA10 may correspond to (and/or constitute) the first-type area NML. The display areas SDA3, SDA4, SDA5, SDA7, SDA9, and SDA10 may correspond to the first to sixth display drivers 210, 220, 230, 240, 250, and 260, respectively.

The first, second, sixth, eighth, eleventh, and twelfth display areas SDA1, SDA2, SDA6, SDA5, SDA11, and SDA12 may correspond to (and/or constitute) the second-type area BRS. The second-type area BRS may not be directly connected to the display driver 200, and may be electrically connected to the display driver 200 through a connection line passing through the first-type area NML.

Each of the first to twelfth display areas SDA1 to SDA12 may include pixels SP arranged in n pixel columns (n is a positive integer). The n may be 1920, but n may be increased or decreased according to the resolution of the display device. The first display area SDA1 may include first to $n^{th}$ pixels SP1 to SP(n), and the twelfth display area SDA12 may include $(11n+1)^{th}$ to $(12n)^{th}$ pixels SP(11n+1) to SP(12n).

The display area DA may include first to sixth connection lines CL1 to CL6.

The first connection line CL1 may electrically connect the first display driver 210 to the second display area SDA2. The first connection line CL1 may be disposed in the second and third display areas SDA2 and SDA3 to extend to the second-type area BRS via the first-type area NML. The first connection line CL1 may include first to third portions CL1a, CL1b, and CL1c. The first portion CL1a of the first connection line CL1 may be connected to the second switching element ST2 of the demultiplexer 400, and may extend in the second direction (Y-axis direction) in the third display area SDA3. The second portion CL1b of the first connection line CL1 may be bent from the first portion CL1a and extend in a direction opposite to the first direction (X-axis direction). The second portion CL1b of the first connection line CL1 may extend from the third display area SDA3 to the second display area SDA2. The third portion CL1c of the first connection line CL1 may be bent from the second portion CL1b and extend in a direction opposite to the second direction (Y-axis direction). The third portion CL1c of the first connection line CL1 may be connected to one or more data lines provided in the second display area SDA2 through at least one contact pad disposed on the lower side of the second display area SDA2.

The second connection line CL2 may electrically connect the second display driver 220 to the first display area SDA1. The second connection line CL2 may be disposed in the first to fourth display areas SDA1, SDA2, SDA3, and SDA4 to extend to the second-type area BRS via the first-type area NML. The second connection line CL2 may reduce the complexity of the lines of the display panel 100 by bypassing the first connection line CL1. The second connection line CL2 may include first to third portions CL2a, CL2b, and CL2c. The first portion CL2a of the second connection line CL2 may be connected to the third switching element ST3 of the demultiplexer 400, and may extend in the second direction (Y-axis direction) in the fourth display area SDA4. The second portion CL2b of the second connection line CL2 may be bent from the first portion CL2a and extend in a direction opposite to the first direction (X-axis direction). The second portion CL2b of the second connection line CL2 may extend from the fourth display area SDA4 to the first display area SDA1. The third portion CL2c of the second connection line CL2 may be bent from the second portion CL2b and extend in a direction opposite to the second direction (Y-axis direction). The third portion CL2c of the second connection line CL2 may be connected to one or more data lines provided in the first display area SDA1 through at least one contact pad disposed on the lower side of the first display area SDA1.

The third connection line CL3 may electrically connect the third display driver 230 to the sixth display area SDA6. The third connection line CL3 may be disposed in the fifth and sixth display areas SDA5 and SDA6 to extend to the second-type area BRS via the first-type area NML. The third connection line CL3 may include the first to third portions CL3a, CL3b, and CL3c. The first portion CL3a of the third connection line CL3 may be connected to the second switching element ST2 of the demultiplexer 400, and may extend in the second direction (Y-axis direction) in the fifth display area SDA5. The second portion CL3b of the third connection line CL3 may be bent from the first portion CL3a and extend in the first direction (X-axis direction). The second portion CL3b of the third connection line CL3 may extend from the fifth display area SDA5 to the sixth display area SDA6. The third portion CL3c of the third connection line CL3 may be bent from the second portion CL3b and extend in a direction opposite to the second direction (Y-axis direction). The third portion CL3c of the third connection line CL3 may be connected to one or more data lines provided in the sixth display area SDA6 through at least one contact pad disposed on the lower side of the sixth display area SDA6.

The fourth connection line CL4 may electrically connect the fourth display driver 240 to the eighth display area SDA8. The fourth connection line CL4 may be disposed in the seventh and eighth display areas SDA7 and SDA8 to extend to the second-type area BRS via the first-type area NML. The fourth connection line CL4 may include first to third portions CL4a, CL4b, and CL4c. The first portion CL4a of the fourth connection line CL4 may be connected to the second switching element ST2 of the demultiplexer 400, and may extend in the second direction (Y-axis direction) in the seventh display area SDA7. The second portion CL4b of the fourth connection line CL4 may be bent from the first portion CL4a and extend in the first direction (X-axis direction). The second portion CL4b of the fourth connection line CL4 may extend from the seventh display area SDA7 to the eighth display area SDA8. The third portion CL4c of the fourth connection line CL4 may be bent from the second portion CL4b and extend in a direction opposite to the second direction (Y-axis direction). The third portion CL4c of the fourth connection line CL4 may be connected to one or more data lines provided in the eighth display area SDA8 through at least one contact pad disposed on the lower side of the eighth display area SDA8.

The fifth connection line CL5 may electrically connect the fifth display driver 250 to the twelfth display area SDA12. The fifth connection line CL5 may be disposed in the ninth to twelfth display areas SDA9, SDA10, SDA11, and SDA12 to extend to the second-type area BRS via the first-type area NML. The fifth connection line CL5 may reduce the complexity of the lines of the display panel 100 by bypassing the sixth connection line CL6. The fifth connection line CL5 may include first to third portions CL5a, CL5b, and CL5c. The first portion CL5a of the fifth connection line CL5 may be connected to the second switching element ST2 of the demultiplexer 400, and may extend in the second direction (Y-axis direction) in the ninth display area SDA9. The second portion CL5b of the fifth connection line CL5 may be bent from the first portion CL5a and extend in the first direction (X-axis direction). The second portion CL5b of the fifth connection line CL5 may extend from the ninth display area SDA9 to the twelfth display area SDA12. The third portion CL5c of the fifth connection line CL5 may be bent from the second portion CL5b and extend in a direction opposite to the second direction (Y-axis direction). The third portion CL5c of the fifth connection line CL5 may be connected to one or more data lines provided in the twelfth display area SDA12 through at least one contact pad disposed on the lower side of the twelfth display area SDA12.

The sixth connection line CL6 may electrically connect the sixth display driver 260 to the eleventh display area SDA11. The sixth connection line CL6 may be disposed in the tenth and eleventh display areas SDA10 and SDA11 to extend to the second-type area BRS via the first-type area NML. The sixth connection line CL6 may include first to third portions CL6a, CL6b, and CL6c. The first portion CL6a of the sixth connection line CL6 may be connected to the third switching element ST3 of the demultiplexer 400, and may extend in the second direction (Y-axis direction) in the tenth display area SDA10. The second portion CL6b of the sixth connection line CL6 may be bent from the first portion CL6a and extend in the first direction (X-axis direction). The second portion CL6b of the sixth connection line CL6 may extend from the tenth display area SDA10 to the eleventh display area SDA11. The third portion CL6c of the sixth connection line CL6 may be bent from the second portion CL6b and extend in a direction opposite to the second direction (Y-axis direction). The third portion CL6c of the sixth connection line CL6 may be connected to one or more data lines provided in the eleventh display area SDA11 through at least one contact pad disposed on the lower side of the eleventh display area SDA11.

The display area DA includes the first to sixth connection lines CL1, CL2, CL3, CL4, CL5 and CL6 extending to the second-type area BRS via the first-type area NML, so that the periphery of the second-type area BRS may be simplified. Advantageously, design freedom may be improved, and costs may be reduced.

The display device 10 may include a demultiplexer 400 disposed between the display driver 200 and the first-type area NML. The demultiplexer 400 may be connected to the display driver 200 through fan-out lines FOL, and may be connected to a data line or a connection line through the first and second fan-out lines FOL1 and FOL2. The demultiplexer 400 may divide the outputs of the display driver 200 received through the fan-out line FOL into the first and second fan-out lines FOL1 and FOL2 and may output the divided outputs. The demultiplexer 400 may time-divide one input into two outputs. The demultiplexer 400 may time-divide one input into three or more outputs using a high-frequency clock signal, and may reduce the number of display drivers 200 as the frequency of the clock signal increases.

The demultiplexer 400 may electrically connect the display driver 200 to one of the first-type area NML and the second-type area BRS during the first period t1, and may electrically connect the display driver 200 to the other of the first-type area NML and the second-type area BRS during the second period t2.

The demultiplexer 400 may include first to fourth switching elements ST1 to ST4. The first switching element ST1 may be turned on in the first period t1 based on the first clock signal CLA to connect the display driver 200 to a data line of the first-type area NML. The second switching element ST2 may be turned on in the second period t2 based on the second clock signal CLB to electrically connect the display driver 200 to the second-type area BRS. The third switching element ST3 may be turned on in the first period t1 based on the first clock signal CLA to electrically connect the display driver 200 to the second-type area BRS. The fourth switching element ST4 may be turned on in the second period t2 based on the second clock signal CLB to connect the display driver 200 to a data line of the first-type area NML.

The demultiplexer 400 may connect the first display driver 210 to a data line of the third display area SDA3 during the first period t1. The demultiplexer 400 may turn on the first switching element ST1 during the first period t1. Accordingly, the first display driver 210 may supply a data voltage to the third display area SDA3 during the first period t1.

The demultiplexer 400 may connect the first display driver 210 to the first connection line CL1 during the second period t2. The demultiplexer 400 may turn on the second switching element ST2 during the second period t2, and the output of the first display driver 210 may be supplied to the first connection line CL1. Accordingly, the first display driver 210 may supply a data voltage to the second display area SDA2 during the second period t2.

The demultiplexer 400 may connect the second display driver 220 to the second connection line CL2 during the first period t1. The demultiplexer 400 may turn on the third switching element ST3 during the first period t1, and the output of the second display driver 220 may be supplied to the second connection line CL2. Accordingly, the second display driver 220 may supply a data voltage to the first display area SDA1 during the first period t1.

The demultiplexer 400 may connect the second display driver 220 to a data line of the fourth display area SDA4 during the second period t2. The demultiplexer 400 may turn on the fourth switching element ST4 during the second period t2. Accordingly, the second display driver 220 may supply a data voltage to the fourth display area SDA4 during the second period t2.

The demultiplexer 400 may connect the third display driver 230 to a data line of the fifth display area SDA5 during the first period t1. The demultiplexer 400 may turn on the first switching element ST1 during the first period t1. Accordingly, the third display driver 230 may supply a data voltage to the fifth display area SDA5 during the first period t1.

The demultiplexer 400 may connect the third display driver 230 to the third connection line CL3 during the second period t2. The demultiplexer 400 may turn on the second switching element ST2 during the second period t2, and the output of the third display driver 230 may be supplied to the third connection line CL3. Accordingly, the third display driver 230 may supply a data voltage to the sixth display area SDA6 during the second period t2.

The demultiplexer 400 may connect the fourth display driver 240 to a data line of the seventh display area SDA7 during the first period t1. The demultiplexer 400 may turn on the first switching element ST1 during the first period t1.

Accordingly, the fourth display driver 240 may supply a data voltage to the seventh display area SDA7 during the first period t1.

The demultiplexer 400 may connect the fourth display driver 240 to the fourth connection line CL4 during the second period t2. The demultiplexer 400 may turn on the second switching element ST2 during the second period t2, and the output of the fourth display driver 240 may be supplied to the fourth connection line CL4. Accordingly, the fourth display driver 240 may supply a data voltage to the eighth display area SDA8 during the second period t2.

The demultiplexer 400 may connect the fifth display driver 250 to a data line of the ninth display area SDA9 during the first period t1. The demultiplexer 400 may turn on the first switching element ST1 during the first period t1. Accordingly, the fifth display driver 250 may supply a data voltage to the ninth display area SDA9 during the first period t1.

The demultiplexer 400 may connect the fifth display driver 250 to the fifth connection line CL5 during the second period t2. The demultiplexer 400 may turn on the second switching element ST2 during the second period t2, and the output of the fifth display driver 250 may be supplied to the fifth connection line CL5. Accordingly, the fifth display driver 250 may supply a data voltage to the twelfth display area SDA12 during the second period t2.

The demultiplexer 400 may connect the sixth display driver 260 to the sixth connection line CL6 during the first period t1. The demultiplexer 400 may turn on the third switching element ST3 during the first period t1, and the output of the sixth display driver 260 may be supplied to the sixth connection line CL6. Accordingly, the sixth display driver 260 may supply a data voltage to the eleventh display area SDA11 during the first period t1.

The demultiplexer 400 may connect the sixth display driver 260 to a data line of the tenth display area SDA10 during the second period t2. The demultiplexer 400 may turn on the fourth switching element ST4 during the second period t2. Accordingly, the sixth display driver 260 may supply a data voltage to the tenth display area SDA10 during the second period t2.

The display device 10 may drive the twelve display areas SDA1 to SDA12 using the six display drivers 210 to 260 by including the first to sixth connection lines CL1 to L6. The second connection line CL2 may bypass the first connection line CL1, and the fifth connection line CL5 may bypass the sixth connection line CL6, so that the complexity of the lines of the display panel 100 may be reduced. The display device 10 may drive the odd display area and the even display area by performing time division driving. As illustrated by the display device 10, embodiments may improve design freedom and reduce costs by including the second-type area BRS free from structural constraints of the display driver 200.

Figure 18:
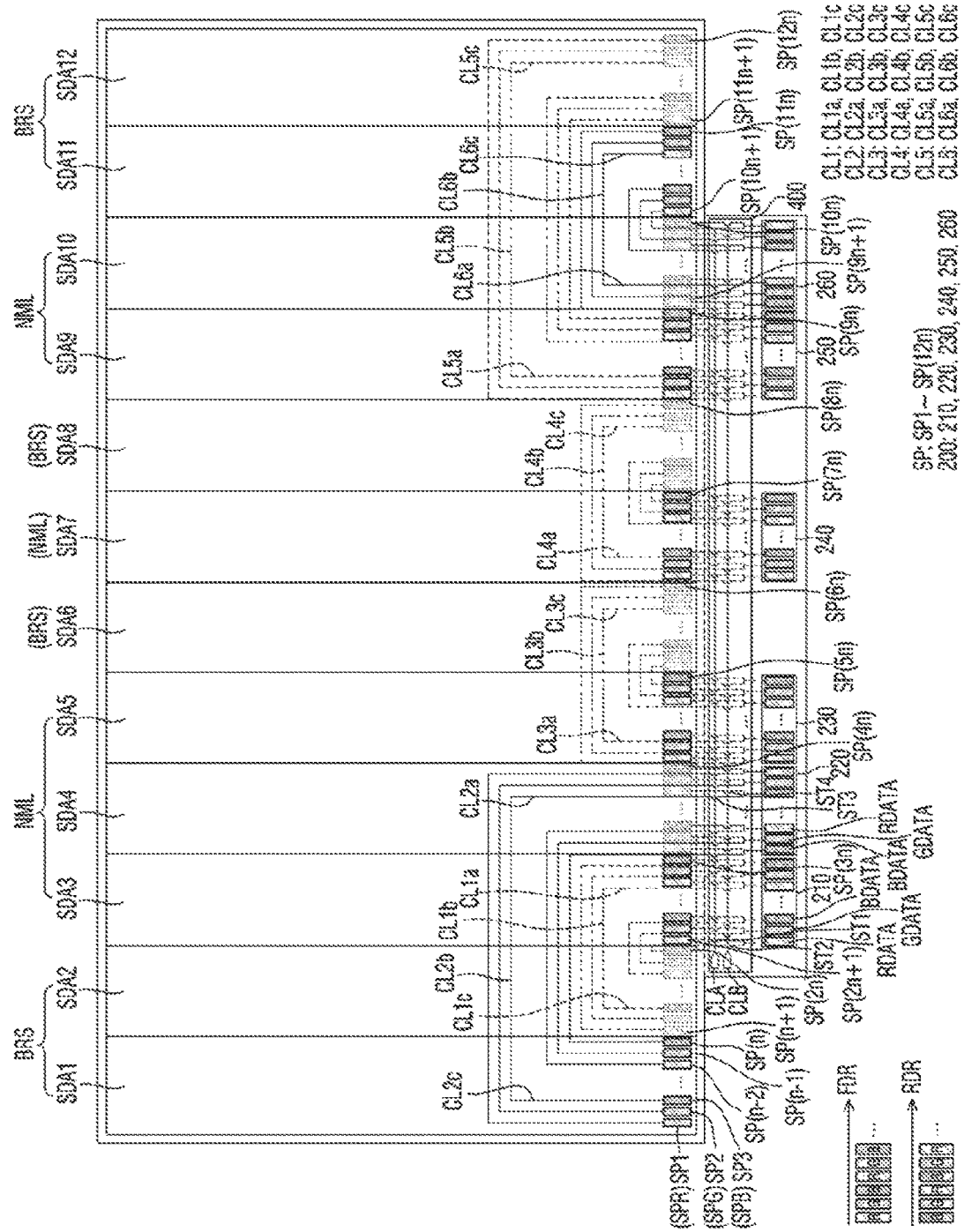
FIG. 18 is a diagram illustrating an operation of a display device during a first period according to one embodiment.

FIG. 18 is a diagram illustrating an operation of a display device during a first period according to one embodiment.

Referring to FIG. 18, an odd display area among the first to twelfth display areas SDA1 to SDA12 may receive a data voltage from the display driver 200 during the first period t1 and may display an image.

The first and third to fifth display drivers 210, 230, 240, and 250 may have an output mapping in the forward direction FDR during the first period t1. The first and third to fifth display drivers 210, 230, 240, and 250 may output data voltages mapped in the order of the red data RDATA, the green data GDATA, and the blue data BDATA to fan-out lines FOL. The data voltages outputted from the first display driver 210 may maintain the order of the forward direction FDR, and may be supplied to pixels SP arranged in the order of the red pixel SPR, the green pixel SPG, and the blue pixel SPB in the third display area SDA3. The data voltages outputted from the third display driver 230 may maintain the order of the forward direction FUR, and may be supplied to pixels SP arranged in the order of the red pixel SPR, the green pixel SPG, and the blue pixel SPB in the fifth display area SDA5. The data voltages outputted from the fourth display driver 240 may maintain the order of the forward direction FUR, and may be supplied to pixels SP arranged in the order of the red pixel SPR, the green pixel SPG, and the blue pixel SPB in the seventh display area SDA7. The data voltages outputted from the fifth display driver 250 may maintain the order of the forward direction FDR, and may be supplied to pixels SP arranged in the order of the red pixel SPR, the green pixel SPG, and the blue pixel SPB in the ninth display area SDA9.

The second and sixth display drivers 220 and 260 may have an output mapping in the reverse direction RDR during the first period t1. The second and sixth display drivers 220 and 260 may output data voltages mapped in the order of the blue data BDATA, the green data GDATA, and the red data RDATA to fan-out lines FOL. The order of the data voltages outputted from the second display driver 220 may be inverted by the second connection line CL2, and may be supplied to pixels SP arranged in the order of the red pixel SPR, the green pixel SPG, and the blue pixel SPB in the first display area SDA1. The order of the data voltages outputted from the sixth display driver 260 may be inverted by the sixth connection line CL6, and may be supplied to pixels SP arranged in the order of the red pixel SPR, the green pixel SPG, and the blue pixel SPB in the eleventh display area SDA11.

The first and third to fifth display drivers 210, 230, 240, and 250 may have an output mapping in the same direction by being disposed to correspond to the odd display area. When the first display driver 210 has an output mapping in the forward direction FDR, the third to fifth display drivers 230, 240, and 250 may also have an output mapping in the forward direction FDR. The second and sixth display drivers 220 and 260 may have an output mapping in the same direction by being disposed to correspond to the even display area. When the second display driver 220 has an output mapping in the reverse direction RDR, the sixth display driver 260 may also have an output mapping in the reverse direction RDR.

The first to sixth display drivers 210 to 260 may control the direction of an output mapping through hardware settings and/or software settings. The display device 10 may display an image in the odd display area during the first period t1 by setting the output mapping of the first and third to fifth display drivers 210, 230, 240, and 250 in the forward direction FDR and setting the output mapping of the second and sixth display drivers 220 and 260 in the reverse direction RDR. The display device 10 may include standardized display driver 200 for controlling the display panel 100. According to the design of the display panel, the output mapping directions of the display driver 200 may be suitably configured.

Figure 19:
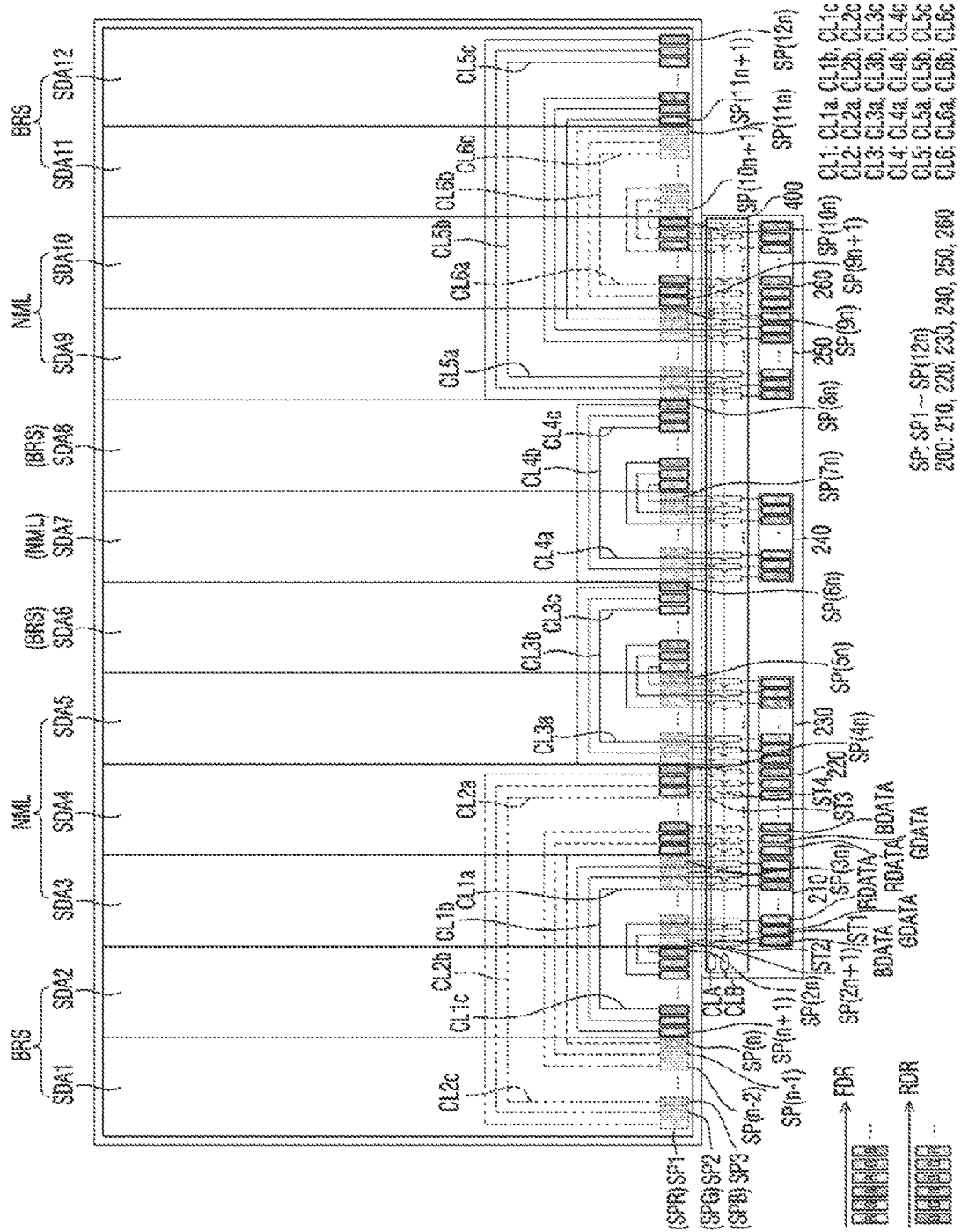
FIG. 19 is a diagram illustrating an operation of a display device during a second period according to one embodiment.

FIG. 19 is a diagram illustrating an operation of a display device during a second period according to one embodiment.

Referring to FIG. 19, an even display area among the first to twelfth display areas SDA1 to SDA12 may receive a data voltage from the display driver 200 during the second period t2 and may display an image.

The first and third to fifth display drivers 210, 230, 240, and 250 may have an output mapping in the reverse direction RDR during the second period t2. The first and third to fifth display drivers 210, 230, 240, and 250 may output data voltages mapped in the order of the blue data BDATA, the green data GDATA, and the red data RDATA to fan-out lines FOL. The order of the data voltages outputted from the first display driver 210 may be inverted by the first connection line CL1, and may be supplied to pixels SP arranged in the order of the red pixel SPR, the green pixel SPG, and the blue pixel SPB in the second display area SDA2. The order of the data voltages outputted from the third display driver 230 may be inverted by the third connection line CL3, and may be supplied to pixels SP arranged in the order of the red pixel SPR, the green pixel SPG, and the blue pixel SPB in the sixth display area SDA6. The order of the data voltages outputted from the fourth display driver 240 may be inverted by the fourth connection line CL4, and may be supplied to pixels SP arranged in the order of the red pixel SPR, the green pixel SPG, and the blue pixel SPB in the eighth display area SDA8. The order of the data voltages outputted from the fifth display driver 250 may be inverted by the fifth connection line CL5, and may be supplied to pixels SP arranged in the order of the red pixel SPR, the green pixel SPG, and the blue pixel SPB in the twelfth display area SDA12.

The second and sixth display drivers 220 and 260 may have an output mapping in the forward direction FDR during the second period t2. The second and sixth display drivers 220 and 260 may output data voltages mapped in the order of the red data RDATA, the green data GDATA, and the blue data BDATA to fan-out lines FOL. The data voltages outputted from the second display driver 220 may maintain the order of the forward direction FDR, and may be supplied to pixels SP arranged in the order of the red pixel SPR, the green pixel SPG, and the blue pixel SPB in the fourth display area SDA4. The data voltages outputted from the sixth display driver 260 may maintain the order of the forward direction FDR, and may be supplied to pixels SP arranged in the order of the red pixel SPR, the green pixel SPG, and the blue pixel SPB in the tenth display area SDA10.

The first and third to fifth display drivers 210, 230, 240, and 250 may have an output mapping in the same direction by being disposed to correspond to the odd display area. When the first display driver 210 has an output mapping in the reverse direction RDR, the third to fifth display drivers 230, 240, and 250 may also have an output mapping in the reverse direction RDR. The second and sixth display drivers 220 and 260 may have an output mapping in the same direction by being disposed to correspond to the even display area. When the second display driver 220 has an output mapping in the forward direction FDR, the sixth display driver 260 may also have an output mapping in the forward direction FDR.

The first to sixth display drivers 210 to 260 may control the direction of an output mapping through hardware setting or software setting. The display device 10 may display an image in the even display area during the second period t2 by setting the output mapping of the first and third to fifth display drivers 210, 230, 240, and 250 in the reverse direction RDR and setting the output mapping of the second and sixth display drivers 220 and 260 in the forward direction FDR. The display device 10 may include standardized display drivers 200 for controlling the display panel 100. According to the design of the display panel 100, the output mapping directions of the display drivers 200 may be suitably configured.

What is claimed is:

1. A display device comprising:
   a display panel comprising a first display area, a second display area, a third display area, and a fourth display area, which are sequentially arranged, wherein at least one of the first display area and the second display area is flexible;
   a first connection line overlapping with each of the second display area and the third display area;
   a second connection line overlapping with each of the first display area, the second display area, the third display area, and the fourth display area;
   a second display driver disposed closer to the fourth display area than to the first display area, providing a first data voltage through the second connection line to the first display area during a first period, and providing a fourth data voltage to the fourth display area during a second period immediately following the first period; and
   a first display driver disposed closer to the third display area than to the second display area, providing a second data voltage through the first connection line to the second display area during the second period, and providing a third data voltage to the third display area during the first period.

2. The display device of claim 1, wherein the first display driver has an output mapping in a forward direction during the first period, and the second display driver has an output mapping in a reverse direction opposite to the forward direction during the first period.

3. The display device of claim 2, wherein the first display driver has an output mapping in the reverse direction during the second period, and the second display driver has an output mapping in the forward direction during the second period.

4. The display device of claim 1, further comprising a demultiplexer disposed between the third display area and the first display driver, disposed between the fourth display area and the second display drivers, and configured to divide and output outputs of the first display driver and the second display driver during the first period and the second period.

5. The display device of claim 4, wherein the demultiplexer comprises:
   a first switching element configured to electrically connect the third display area to the first display driver during the first period;
   a second switching element configured to electrically connect the first connection line to the first display driver during the second period;
   a third switching element configured to electrically connect the second connection line to the second display driver during the first period; and
   a fourth switching element configured to electrically connect the fourth display area to the second display driver during the second period.

6. The display device of claim 5, wherein the first connection line comprises:
   a first section extending lengthwise in a first direction in the third display area;
   a second section extending lengthwise in a second direction different from the first direction and electrically connected through the first section to the second switching element; and
   a third section electrically connected through the second section to the first section and extending lengthwise parallel to the first section in the second display area.

7. The display device of claim 5, wherein the second connection line comprises:
- a first section extending lengthwise in a first direction in the fourth display area;
- a second section extending in a second direction different from the first direction and electrically connected through the first section to the third switching element; and
- a third section electrically connected through the second section to the first section and extending lengthwise parallel to the first section in the first display area.

8. The display device of claim 1, further comprising:
- a third display driver; and
- a fourth display driver, wherein the display panel further comprises:
- a fifth display area abutting the fourth display area and disposed closer to the third display driver than to the fourth display driver;
- a sixth display area abutting the fifth display area and disposed closer to the fourth display driver than to the third display driver;
- a seventh display area abutting the sixth display area; and
- an eighth display area abutting the seventh display area, at least one of the seventh display area and the eighth display area being flexible.

9. The display device of claim 8, further comprising:
- a third connection line overlapping with each of the fifth display area, the sixth display area, the seventh display area, and the eighth display area; and
- a fourth connection line overlapping with each of the sixth display area and the seventh display area, wherein the fifth display area receives a fifth data voltage from the third display driver during the first period,
- the sixth display area receives a sixth data voltage from the fourth display driver during the second period,
- the seventh display area receives a seventh data voltage from the fourth display driver through the fourth connection line during the first period, and
- the eighth display area receives an eighth data voltage from the third display driver through the third connection line during the second period.

10. The display device of claim 8, wherein the third display driver has an output mapping in a forward direction during the first period, and the fourth display driver has an output mapping in a reverse direction opposite to the forward direction during the first period.

11. The display device of claim 10, wherein the third display driver has an output mapping in the reverse direction during the second period, and the fourth display driver has an output mapping in the forward direction during the second period.

12. The display device of claim 1, further comprising: a third display driver, wherein the display panel further comprises:
- a fifth display abutting the fourth display area and disposed closer to the third display driver than to the second display driver; and
- a sixth display area abutting the fifth display area, disposed farther from the third display deriver than the fifth display area, and being flexible.

13. The display device of claim 12, wherein the fifth display area receives a fifth data voltage from the third display driver during the first period, and the sixth display area receives a sixth data voltage from the third display driver during the second period.

14. The display device of claim 12, wherein the third display driver has an output mapping in a forward direction during the first period and has an output mapping in a reverse direction opposite to the forward direction during the second period.

15. A display device comprising:
- a display panel comprising a first display area, a second display, a third display area, a fourth display area, a fifth display area, and a sixth display area, which are sequentially arranged, wherein at least one of the first display area, the second display area, and the third display area is flexible;
- a first display driver positioned closer to the fourth display area than to the fifth display area;
- a second display driver disposed closer to the fifth display area than to each of the fourth display area and the sixth display area; and
- a third display driver disposed closer to the fourth and sixth display area than to the fifth display area,
- wherein the first display area receives a first data voltage from the third display driver during a first period,
- the second display area receives a second data voltage from the second display driver during a second period immediately following the first period,
- the third display area receives a third data voltage from the first display driver during the first period,
- the fourth display area receives a fourth data voltage from the first display driver during the second period,
- the fifth display area receives a fifth data voltage from the second display driver during the first period, and
- the sixth display area receives a sixth data voltage from the third display driver during the second period.

16. The display device of claim 15, further comprising:
- a first connection line disposed in the third display area and the fourth display area for electrically connecting the third display area to the first display driver;
- a second connection line disposed in the second display area, the third display area, the fourth display area, and the fifth display area for electrically connecting the second display area to the second display driver; and
- a third connection line disposed in the first display area, the second display area, the third display area, the fourth display area, the fifth display area, and the sixth display area for electrically connecting the first display area to the third display driver.

17. The display device of claim 16, further comprising a demultiplexer disposed between the fourth display area and the first display driver, disposed between the fifth display area and the second display driver, disposed between the sixth display area and the third display driver, and configured to divide and output outputs of the first display driver, the second display driver, and the third display drivers during the first period and the second period.

18. The display device of claim 17, wherein the demultiplexer comprises:
- a first switching element configured to electrically connect the first connection line to the first display driver during the first period;
- a second switching element configured to electrically connect the fourth display area to the first display driver during the second period;
- a third switching element configured to electrically connect the fifth display area to the second display driver during the first period; and
- a fourth switching element configured to electrically connect the second connection line to the second display driver during the second period.

19. A display device comprising:
  a display panel comprising a first display area, a second display area, a third display area, and a fourth display area, which are sequentially arranged, wherein at least one of the first display area and the second display area is flexible;
  a first display driver disposed closer to the third display area than to the fourth display area;
  a second display driver disposed closer to the fourth display area than to the third display area; and
  a demultiplexer disposed between the third display area and the first display driver, disposed between the fourth display area and the second display driver, electrically connecting the first display driver to the third display area during a first period, electrically connecting the second display driver to the first display area during the first period, electrically connecting the first display driver to the second display area during a second period immediately following the first period, and electrically connecting the second display driver to the fourth display area during the second period.

20. The display device of claim 19, wherein the first display driver has an output mapping in a forward direction during the first period, and the second display driver has an output mapping in a reverse direction opposite to the forward direction during the first period.

21. The display device of claim 19, wherein the first display driver has an output mapping in the reverse direction during the second period, and the second display driver has an output mapping in the forward direction during the second period.

22. The display device of claim 19, further comprising:
  a first connection line disposed in the second display area and the third display area for electrically connecting the second display area to the first display driver; and
  a second connection line disposed in the first display area, the second display area, the third display area, and the fourth display area for electrically connecting the first display area to the second display driver.

23. The display device of claim 22, wherein the demultiplexer comprises:
  a first switching element configured to electrically connect the third display area to the first display driver during the first period;
  a second switching element configured to electrically connect the first connection line to the first display driver during the second period;
  a third switching element configured to electrically connect the second connection line to the second display driver during the first period; and
  a fourth switching element configured to electrically connect the fourth display area to the second display driver during the second period.

* * * * *